United States Patent
Mikami

(10) Patent No.: US 9,720,316 B2
(45) Date of Patent: Aug. 1, 2017

(54) REFLECTIVE MASK BLANK FOR EUV LITHOGRAPHY AND PROCESS FOR ITS PRODUCTION, AS WELL AS SUBSTRATE WITH REFLECTIVE LAYER FOR SUCH MASK BLANK AND PROCESS FOR ITS PRODUCTION

(71) Applicant: Asahi Glass Company, Limited, Chiyoda-ku (JP)

(72) Inventor: Masaki Mikami, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 110 days.

(21) Appl. No.: 14/882,953

(22) Filed: Oct. 14, 2015

(65) Prior Publication Data

US 2016/0109792 A1    Apr. 21, 2016

(30) Foreign Application Priority Data

Oct. 21, 2014  (JP) .................................. 2014-214466

(51) Int. Cl.
G03F 1/22   (2012.01)
G03F 1/24   (2012.01)

(52) U.S. Cl.
CPC ...................................... G03F 1/24 (2013.01)

(58) Field of Classification Search
None
See application file for complete search history.

(56) References Cited

U.S. PATENT DOCUMENTS

| | | |
|---|---|---|
| 9,052,601 B2 | 6/2015 | Mikami |
| 2006/0251973 A1* | 11/2006 | Takaki ............... C03C 17/3649 430/5 |
| 2015/0160548 A1 | 6/2015 | Mikami |

FOREIGN PATENT DOCUMENTS

| | | |
|---|---|---|
| JP | 2002-122981 | 4/2002 |
| JP | 2005-268750 | 9/2005 |
| JP | 2009-260183 | 11/2009 |
| JP | 2014-17442 | 1/2014 |
| JP | 2014-56960 | 3/2014 |
| JP | 2014-130976 | 7/2014 |

* cited by examiner

*Primary Examiner* — Stephen Rosasco
(74) *Attorney, Agent, or Firm* — Oblon, McClelland, Maier & Neustadt, L.L.P.

(57) ABSTRACT

A mask blank for EUV lithography (EUVL) excellent in in-plane uniformity of the peak reflectivity of light in the EUV wavelength region and in in-plane uniformity of the center wavelength of reflected light in the EUV wavelength region, at the surface of a multilayer reflective film, and a process for its production, as well as a substrate with reflective layer for EUVL to be used for the production of such a mask blank for EUVL, and a process for its production. A substrate with reflective layer for EUVL having a reflective layer for reflecting EUV light formed on a substrate, where the reflective layer is a multilayer reflective film having a low refractive index layer and a high refractive index layer alternately stacked plural times.

18 Claims, 8 Drawing Sheets

US 9,720,316 B2

REFLECTIVE MASK BLANK FOR EUV LITHOGRAPHY AND PROCESS FOR ITS PRODUCTION, AS WELL AS SUBSTRATE WITH REFLECTIVE LAYER FOR SUCH MASK BLANK AND PROCESS FOR ITS PRODUCTION

TECHNICAL FIELD

The present invention relates to a reflective mask blank for EUV (Extreme Ultraviolet) lithography (hereinafter referred to as "mask blank for EUVL" in this specification) to be used for the production of semiconductors, etc., and a process for its production.

Further, the present invention relates to a substrate with reflective layer for EUV lithography (EUVL), and a process for its production. The substrate with reflective layer for EUVL is used as a precursor for the mask blank for EUVL.

BACKGROUND ART

Heretofore, in the semiconductor industry, a photolithography method employing visible light or ultraviolet light has been used as a technique to transfer a fine pattern required to form an integrated circuit with a fine pattern on e.g. a silicon substrate. However, the conventional photolithography method has come close to its limit, while miniaturization of semiconductor devices is being accelerated. In the case of the photolithography method, the resolution limit of a pattern is about ½ of the exposure wavelength. Even if an immersion method is employed, the resolution limit is said to be about ¼ of the exposure wavelength, and even if an immersion method of ArF laser (wavelength: 193 nm) is employed, about 45 nm is presumed to be the limit. Under the circumstances, as an exposure technique for the next generation employing an exposure wavelength shorter than 45 nm, EUV lithography is expected to be prospective, which is an exposure technique employing EUV light having a wavelength further shorter than ArF laser. In this specification, EUV light is meant for a light ray having a wavelength within a soft X-ray region or within a vacuum ultraviolet region, specifically for a light ray having a wavelength of from about 10 to 20 nm, particularly about 13.5 nm±0.3 nm (from about 13.2 to 13.8 nm).

EUV light is likely to be absorbed by all kinds of substances, and the refractive index of substances at such a wavelength is close to 1, whereby it is not possible to use a conventional dioptric system like photolithography employing visible light or ultraviolet light. Therefore, in EUV lithography, a catoptric system, i.e. a combination of a reflective photomask and a mirror, is employed.

A mask blank is a stacked member before pattering, to be employed for the production of a photomask. In the case of an EUV mask blank, it has a structure wherein a reflective layer to reflect EUV light and an absorber layer to absorb EUV light, are formed in this order on a substrate made of e.g. glass.

As the reflective layer, it is common to use a multilayer reflective film having a low refractive index layer with a low refractive index to EUV light and a high refractive index layer with a high refractive index to EUV light, alternately stacked to have the light reflectivity improved when its surface is irradiated with EUV light. Specifically as such a multilayer reflective film, there is, for example, a Mo/Si multilayer reflective film having a molybdenum (Mo) layer as a low refractive index layer and a silicon (Si) layer as a high refractive index layer alternately stacked.

For the absorber layer, a material having a high absorption coefficient to EUV light, specifically e.g. a material containing chromium (Cr) or tantalum (Ta) as the main component, is used.

Usually, a capping layer (i.e. a protective layer) is formed between the above-described reflective layer and the absorber layer. Such a protective layer is one to be provided for the purpose of protecting the reflective layer, so that the reflective layer will not be damaged by an etching process to be carried out for the purpose of forming a pattern on the absorber layer. In Patent Document 1, it is proposed to use ruthenium (Ru) as the material for the protective layer. In Patent Document 2, a protective layer is proposed which is made of a ruthenium compound (Ru content: 10 to 95 at %) containing Ru and at least one member selected from Mo, Nb, Zr, Y, B, Ti and La.

Further, as disclosed in Patent Document 3, in a mask blank for EUVL, it has been problematic that in-plane distribution of the peak reflectivity of light in the EUV wavelength region occurs at the surface of a multilayer reflective film. When a reflectivity spectrum of light in the EUV wavelength region at the surface of the multilayer reflective film is measured, the value of reflectivity varies depending upon the wavelength for measurement, and has a local maximum value i.e. the peak reflectivity. If in-plane distribution of the peak reflectivity of light in the EUV wavelength region at the surface of the multilayer reflective film of a mask blank for EUVL (i.e. such a state that the peak reflectivity varies depending upon the locations on the multilayer reflective film) occurs, at the time when EUVL is carried out by using a mask for EUVL prepared from such a mask blank for EUVL, in-plane distribution of the EUV exposure amount applied to the resist on a wafer will occur. This causes fluctuations in the dimension of a pattern in the exposure field and thus becomes a factor to impair high precision patterning.

In Patent Document 3, the required value relating to the in-plane uniformity of the peak reflectivity of light in the EUV wavelength region at the surface of the multilayer reflective film is set to be within ±0.25%. Further, in a case where a protective layer is formed on the multilayer reflective film, the required value relating to the in-plane uniformity of the peak reflectivity of light in the EUV wavelength region at the surface of the protective layer is set to be within ±0.25%.

Therefore, in Patent Document 3, with respect to the in-plane uniformity of the peak reflectivity of light in the EUV wavelength region at the surface of the multilayer reflective film or at the surface of the protective layer, its range (the difference between the maximum value and the minimum value of the peak reflectivity) is required to be within 0.5%.

Further, as disclosed in Patent Document 3, in a mask blank for EUVL, it is also problematic that in-plane distribution of the center wavelength of reflected light, specifically, in-plane distribution of the center wavelength of reflected light in the EUV wavelength region at the surface of the multilayer reflective film, occurs. Here, the center wavelength of reflected light in the EUV wavelength region is, when the wavelengths corresponding to FWHM (full width of half maximum) of the peak reflectivity in the reflectivity spectrum in the EUV wavelength region are represented by $\lambda 1$ and $\lambda 2$, a wavelength that becomes the center value of these wavelengths $((\lambda 1+\lambda 2)/2)$.

In Patent Document 3, the required value relating to the in-plane uniformity of the center wavelength of reflected light in the EUV wavelength region at the surface of the multilayer reflective film is set to be within ±0.03 nm. Further, in a case where a protective layer is formed on the multilayer reflective film, the required value relating to the in-plane uniformity of the center wavelength at the surface of the protective layer is set to be within ±0.03 nm.

Therefore, with respect to the in-plane uniformity of the center wavelength of reflected light in the EUV wavelength region at the surface of the multilayer reflective film or at the surface of the protective layer, its range (the difference between the maximum value and the minimum value of the center wavelength) is required to be within 0.06 nm.

In order to solve such problems of the prior art, the present applicant has disclosed in Patent Document 4 a process for producing a mask blank for EUVL excellent in the in-plane uniformity of the peak reflectivity of light in the EUV wavelength region and in the in-plane uniformity of the center wavelength of reflected light in the EUV wavelength region, at the surface of a multilayer reflective film, as well as a substrate with reflective layer for EUVL to be used for the production of such a mask blank for EUVL, and a process for its production.

In the mask blank for EUVL and the substrate with reflective layer for EUVL as disclosed in Patent Document 4, at least one layer among the respective layers constituting the multilayer reflective film is made to be a reflectivity distribution correction layer having a thickness distribution provided in a radial direction from the center of the substrate, to suppress the in-plane distribution of the peak reflectivity of light in the EUV wavelength region in a radial direction from the center of the substrate to be at most 0.3%.

PRIOR ART DOCUMENTS

Patent Documents

Patent Document 1: JP-A-2002-122981
Patent Document 2: JP-A-2005-268750
Patent Document 3: JP-A-2009-260183
Patent Document 4: JP-A-2014-17442

DISCLOSURE OF INVENTION

Technical Problem

Requirements for the in-plane uniformity of the peak reflectivity of light in the EUV wavelength region becomes strict year by year, and the in-plane distribution of the peak reflectivity of light in the EUV wavelength region in a radial direction from the center of the substrate is required to be at most 0.18%, and is expected to be at most 0.10% in future.

In order to solve the above problems of the prior art, it is an object of the present invention to provide a mask blank for EUVL excellent in the in-plane uniformity of the peak reflectivity of light in the EUV wavelength region and in the in-plane uniformity of the center wavelength of reflected light in the EUV wavelength region on the surface of the multilayer reflective film, and a process for its production, as well as a substrate with reflective layer for EUVL to be used for the production of the mask blank for EUVL, and a process for its production.

Solution to Problem

In order to accomplish the above object, the present invention provides a substrate with reflective layer for EUV lithography (EUVL) having a reflective layer for reflecting EUV light formed on a substrate, wherein the reflective layer is a multilayer reflective film having a low refractive index layer and a high refractive index layer alternately stacked plural times, among the respective layers constituting the multilayer reflective film, at least one layer of at least one pair of adjacent low refractive index layer and high refractive index layer is made to be a reflectivity distribution correction layer, and the reflectivity distribution correction layer has a thickness distribution which satisfies the following formula (1) in a radial direction from the center of the substrate:

$$-0.011x^2+0.1x-100-\alpha \leq y \leq -0.011x^2+0.1x+100+\alpha \quad (1)$$

wherein x is a location in a radial direction from the center of the substrate represented by the relative value where the center of the film-forming surface on the substrate on which the reflective layer is to be formed, is 0%, and the outer edge at the reflectivity measurement position farthest from the center on the film-forming surface, is 100%; y is the amount of change of the thickness of the reflectivity distribution correction layer represented by the rate of change where the minimum value of the thickness of the reflectivity distribution correction layer is 0%, and the maximum value of the thickness of the reflectivity distribution correction layer is 100%; and $\alpha$ is 25.

In the substrate with reflective layer for EUVL of the present invention, the thickness distribution of the reflectivity distribution correction layer may be by the thickness distribution of the low refractive index layer constituting the reflectivity distribution correction layer.

In the substrate with reflective layer for EUVL of the present invention, the thickness distribution of the reflectivity distribution correction layer may be by the thickness distribution of the high refractive index layer constituting the reflectivity distribution correction layer.

In the substrate with reflective layer for EUVL of the present invention, the thickness distribution of the reflectivity distribution correction layer may be by the total thickness distribution of the low refractive index layer and the high refractive index layer constituting the reflectivity distribution correction layer.

The present invention also provides a substrate with reflective layer for EUV lithography (EUVL) having a reflective layer for reflecting EUV light formed on a substrate, wherein the reflective layer is a multilayer reflective film having a low refractive index layer and a high refractive index layer alternately stacked plural times, and the change of the peak reflectivity of light in the EUV wavelength region in a radial direction from the center of the substrate, is preferably within 0.18%.

The substrate with reflective layer for EUVL of the present invention may have a protective layer for the reflective layer formed on the reflective layer.

In the substrate with reflective layer for EUVL of the present invention, it is preferred that in the multilayer reflective film, the stacked number of bilayer of the low refractive index layer and the high refractive index layer is from 30 to 60, and that the reflectivity distribution correction layer is present within a stacked number of bilayer of at most 20 from the uppermost layer of the multilayer reflective film.

In the substrate with reflective layer for EUVL of the present invention, the multilayer reflective film is preferably a Mo/Si multilayer reflective film having a molybdenum (Mo) layer and a silicon (Si) layer alternately stacked plural times.

The present invention further provides a process for producing the above substrate with reflective layer for EUVL, which comprises forming on the substrate the multilayer reflective film by alternately stacking a low refractive index layer and a high refractive index layer plural times by a sputtering method.

The present invention further provides a reflective mask blank for EUV lithography (EUVL), which has an absorber layer for absorbing EUV light formed on the multilayer reflective film or the protective layer of the substrate with reflective layer for EUVL of the present invention.

The reflective mask blank for EUVL of the present invention may have a low reflective layer for inspection light to be used for inspection of a mask pattern formed on the absorber layer.

The present invention still further provides a reflective mask for EUV lithography obtained by patterning the reflective mask blank for EUVL of the present invention.

Advantageous Effects of Invention

According to the present invention, it is possible to produce a reflective mask blank for EUVL and a substrate with reflective layer for EUVL, excellent in the in-plane uniformity of the peak reflectivity of light in the EUV wavelength region and in the in-plane uniformity of the center wavelength of reflected light in the EUV wavelength region, at the surface of the multilayer reflective film.

DESCRIPTION OF EMBODIMENTS

Now, the present invention will be described with reference to the drawings.

Figure 1:
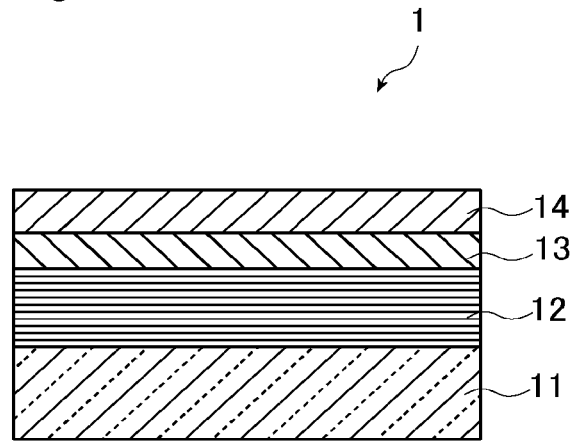
FIG. 1 is a schematic cross-sectional view illustrating an embodiment of the reflective mask blank for EUVL to be produced by the process of the present invention.

FIG. 1 is a schematic cross-sectional view illustrating an embodiment of the reflective mask blank for EUVL of the present invention (hereinafter referred to as "the reflective mask blank for EUVL of the present invention" in this specification). The reflective mask blank 1 for EUVL shown in FIG. 1 has a reflective layer 12 for reflecting EUV light and an absorber layer 14 for absorbing EUV light formed in this order on a substrate 11. Between the reflective layer 12 and the absorber layer 14, a protective layer 13 is formed for protecting the reflective layer 12 during formation of a pattern in the absorber layer 14.

Here, in the reflective mask blank for EUVL of the present invention, in the construction as shown in FIG. 1, only the substrate 11, the reflective layer 12 and the absorber layer 14 are essential, and the protective layer 13 is an optional constituting element.

Now, the individual constituting elements of the reflective mask blank 1 for EUVL will be described.

The substrate 11 is required to satisfy the properties as a substrate for a reflective mask blank for EUVL.

Therefore, the substrate 11 is preferably one having a low thermal expansion coefficient (preferably $0\pm1.0\times10^{-7}/°$ C., more preferably $0\pm0.3\times10^{-7}/°$ C., further preferably $0\pm0.2\times$ $10^{-7}/°$ C., still further preferably $0±0.1×10^{-7}/°$ C., particularly preferably $0±0.05×10^{-7}/°$ C.) and being excellent in smoothness, planarity and durability against a cleaning liquid to be used for e.g. cleaning a mask blank or a photomask after patterning. As the substrate 11, specifically, a glass having a low thermal expansion coefficient, such as a $SiO_2$—$TiO_2$ type glass, may be used. However, the substrate is not limited thereto, and it is possible to employ a substrate of e.g. crystallized glass having β-quartz solid solution precipitated, quartz glass, silicon, or a metal. Further, a film such as a stress correcting film may be formed on the substrate 11.

The substrate 11 preferably has a smooth surface having a Root Mean Square Roughness of at most 0.15 nm and a flatness of at most 100 nm, whereby a high reflectivity and transfer precision can be attained by a photomask after forming a pattern.

The size, thickness, etc. of the substrate 11 may suitably be determined depending upon e.g. the designed values for the mask. In Examples given hereinafter, a $SiO_2$—$TiO_2$ type glass having a size of 6 inches (152 mm) square and a thickness of 0.25 inch (6.35 mm) is used.

It is preferred that no defect is present on the film-forming surface of the substrate 11 i.e. the surface of the substrate 11 on the side where a reflective layer 12 is to be formed. However, even in a case where a defect is present, in order not to cause a phase defect due to a concave defect and/or a convex defect, it is preferred that the depth of a concave defect or the height of a convex defect is not more than 2 nm, and the half value width of such a concave defect or convex defect is not more than 60 nm.

The property particularly required for the reflective layer 12 of the reflective mask blank for EUVL is a high EUV light reflectivity. Specifically, when the surface of the reflective layer 12 is irradiated with a light ray within the EUV wavelength region at an incident angle of 6°, the peak reflectivity of light in the EUV wavelength region (i.e. the local maximum value of the reflectivity of the light ray in the vicinity of a wavelength of 13.5 nm, which will be hereinafter referred to as "the peak reflectivity of EUV light" in this specification) is preferably at least 60%, more preferably at least 63%, further preferably at least 65%. Further, even in a case where a protective layer 13 is formed on the reflective layer 12, the peak reflectivity of EUV light is preferably at least 60%, more preferably at least 63%, further preferably at least 65%. The incident angle of 6° is the current incident angle of EUV light to the reflective mask blank for EUVL at the time when EUVL is carried out, however, the incident angle is not limited to 6°. If the incident angle at the time when EUVL is carried out is changed along with miniaturization of exposure patterns in future, the peak reflectivity of EUV light will be measured at the same incident angle as the incident angle at the time when EUVL is carried out.

Further, for the reflective layer 12 of the reflective mask blank for EUVL, the required value of the in-plane uniformity of the peak reflectivity of EUV light is within 0.18%, preferably within 0.14%, more preferably within 0.10%, further preferably within 0.06%, as its range (the difference between the maximum value and the minimum value of the peak reflectivity).

Further, in a case where a protective layer 13 is formed on the reflective layer 12, the required value of the in-plane uniformity of the peak reflectivity of EUV light at the surface of the protective layer 13 is within 0.18%, preferably within 0.14%, more preferably within 0.10%, further preferably within 0.06% as its range (the difference between the maximum value and the minimum value of the peak reflectivity).

Further, for the reflective layer 12 of the reflective mask blank for EUVL, the required value of the in-plane uniformity of the center wavelength of reflected light in the EUV wavelength region is within 0.06 nm as its range (the difference between the maximum value and the minimum value of the center wavelength). Further, in a case where a protective layer 13 is formed on the reflective layer 12, the required value of the in-plane uniformity of the center wavelength of reflected light in the EUV wavelength region at the surface of the protective layer 13 is within 0.06 nm as its range (the difference between the maximum value and the minimum value of the peak reflectivity).

As a reflective layer of a reflective mask blank for EUVL, a multilayer reflective film having a low refractive index layer as a layer to show a low refractive index to EUV light and a high refractive index layer as a layer to show a high refractive index to EUV light alternately stacked plural times is widely used, since a high reflectivity can thereby be accomplished in the EUV wavelength region. As such a multilayer reflective film, a Mo/Si multilayer reflective film having a molybdenum (Mo) layer as a low refractive index layer and a silicon (Si) layer as a high refractive index layer alternately stacked plural times, is usually employed. Other examples of the multilayer reflective film may, for example, be a Ru/Si multilayer reflective film having a ruthenium (Ru) layer as a low refractive index layer and a silicon (Si) layer as a high refractive index layer alternately stacked plural times, a Mo/Be multilayer reflective film having a molybdenum (Mo) layer as a low refractive index layer and a beryllium (Be) layer as a high refractive index layer alternately stacked plural times, and a Mo compound/Si compound multilayer reflective film having a molybdenum (Mo) compound layer as a low refractive index layer and a silicon (Si) compound layer as a high refractive index layer alternately stacked plural times.

Further, like a multilayer reflective film disclosed in JP-A-2006-093454, the multilayer reflective film may be one having an interlayer such as a diffusion preventive layer or a film stress relaxation layer formed between the low refractive index layer (Mo layer) and the high refractive index layer (Si layer).

The thickness of the respective layers (a low refractive index layer and a high refractive index layer) constituting the multilayer reflective film, and the stacked number of bilayer of the low refractive index layer and the high refractive index layer, vary depending upon the constituting materials for the respective layers or the EUV light reflectivity to be accomplished. In the case of the Mo/Si multilayer reflective film, however, in order to obtain a reflective layer 12 having an EUV light peak reflectivity of at least 60%, for example, a Mo layer having a thickness of 2.5 nm and a Si layer having a thickness of 4.5 nm are stacked so that the stacked number of bilayer would be from 30 to 60.

Further, the respective layers (a Mo layer and a Si layer) constituting the Mo/Si multilayer reflective film are adjusted so that (1) the thickness distribution of the respective layers is a uniform thickness distribution within from 0.4 to 0.3% from the requirement for the above-mentioned wavelength distribution, (2) the respective thicknesses of the Mo layer and the Si layer are adjusted to be thicknesses whereby the maximum reflectivity is obtainable from the adjustment of the after-mentioned y ratio, and (3) the total thickness (bilayer) of the Mo layer and the Si layer is adjusted to be about 7 nm so that the center wavelength of reflected light in the EUV wavelength region will be about 13.5 nm.

Here, the respective layers (a low refractive index layer and a high refractive index layer) constituting the multilayer reflective film may be formed to have desired thicknesses by means of a sputtering method such as a magnetron sputtering method or an ion beam sputtering method. For example, in the case of forming a Mo/Si multilayer reflective film by means of an ion beam sputtering method, it is preferred that a Mo layer is formed to have a thickness of 2.5 nm at an ion accelerating voltage of from 300 to 1,500 V and a film-deposition rate of from 1.8 to 18.0 nm/min by using a Mo target as the target and an Ar gas (gas pressure: $1.3 \times 10^{-2}$ Pa to $2.7 \times 10^{-2}$ Pa) as the sputtering gas, and then, a Si layer is formed to have a thickness of 4.5 nm at an ion accelerating voltage of from 300 to 1,500 V and a film-deposition rate of from 1.8 to 18.0 nm/min by using a Si target as the target and an Ar gas (gas pressure: $1.3 \times 10^{-2}$ Pa to $2.7 \times 10^{-2}$ Pa) as the sputtering gas. When this operation is taken as one cycle, the Mo/Si multilayer reflective film is formed by stacking the Mo layer and the Si layer by from 30 to 60 cycles.

However, in order to satisfy the above-mentioned required value of the in-plane uniformity of the peak reflectivity of EUV light and the required value relating to the in-plane uniformity of the center wavelength of reflected light in the EUV wavelength region, it is required to form a film uniformly so as not to cause in-plane distribution in the thicknesses of the respective layers (a low refractive index layer and a high refractive index layer) constituting the multilayer reflective film.

Figure 2:
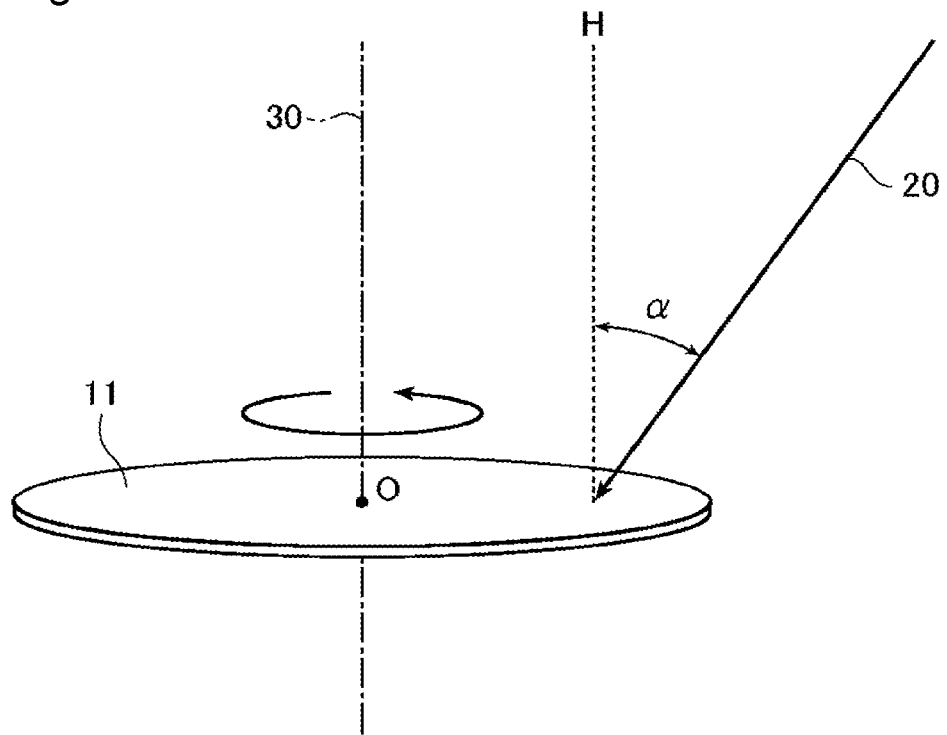
FIG. 2 is an illustrative view showing the procedure for spin film formation.

In order to form the respective layers (a low refractive index layer and a high refractive index layer) constituting the multilayer reflective film to have uniform thicknesses by means of a sputtering method such as a magnetron sputtering method or an ion beam sputtering method, it is preferred that as shown in FIG. 2, while a substrate 11 is rotated around an axis (center axis) 30 passing through its center O, sputtered particles 20 are deposited from an oblique direction to the normal line H to the substrate 11. The reason is such that it is possible to make the thickness of each layer formed by the sputtering method uniform by adjusting the incident angle α of the sputtered particles 20 to the normal line H.

Hereinafter, in this specification, the film-forming procedure as shown in FIG. 2 will be referred to as "spinning film formation". Here, the center axis is an axis passing through the center of the substrate, and in a case where the substrate shape is circular like the substrate 11 shown in FIG. 2, the center axis is an axis passing through the center O of the circle, and in a case where the substrate shape is a square or rectangle, the center axis is an axis passing through the intersection of diagonal lines of the square or rectangle.

In the foregoing, a method for carrying out film formation on a single substrate has been exemplified. However, the method is not limited thereto and may be a so-called a plural substrate film-forming method wherein film formation is carried out simultaneously on plural substrates. In the case of the plural substrate film-forming method, it is preferred to set the film-forming conditions which include not only rotation of substrates about their central axes but also movement of revolution of the substrates.

At the time of forming the respective layers (a low refractive index layer and a high refractive index layer) constituting the multilayer reflective film, it is possible to uniformly control the thicknesses of the respective layers to be formed by the sputtering method, by carrying out a spinning film formation as shown in FIG. 2 and adjusting the incident angle α of sputtered particles 20 to the normal line H.

With respect to the required value relating to the in-plane uniformity of the center wavelength of reflected light in the EUV wavelength region, it is shown in Comparative Example 1 given hereinafter that the respective layers of the Mo/Si multilayer reflective film are uniformly formed to such an extent that its range (the difference between the maximum value and the minimum value of the center wavelength) being within 0.06 nm is satisfied. In Comparative Example 1, the in-plane distribution of the center wavelength of reflected light in the EUV wavelength region is within 0.04 nm, which satisfies its range being within 0.06 nm as the required value relating to the in-plane uniformity of the center wavelength of reflected light in the EUV wavelength region. Here, the above in-plane distribution (within 0.04 nm) of the center wavelength of reflected light in the EUV wavelength region corresponds to 0.04/13.53≈0.3% as the thickness distribution of a bilayer composed of two layers of the Mo layer and the Si layer as the basic construction of the Mo/Si multilayer film.

However, even in a case where the thicknesses of the respective layers of the Mo/Si multilayer reflective film are uniformly formed to such a level that with respect to the required value relating to the in-plane uniformity of the center wavelength of reflected light in the EUV wavelength region, its range being within 0.06 nm is satisfied, there may be a case where in-plane distribution exceeding the require value results in the peak reflectivity of EUV light. This is shown by the results before correction in Examples (FIGS. 6, 8, 10, 12, 14 and 16) given hereinafter.

In FIGS. 6, 8, 10, 12, 14 and 16, before correction indicated by a dashed line, in-plane distribution is shown such that the peak reflectivity of EUV light lowers from the center of the substrate towards the peripheral portion of the substrate. The in-plane distribution of the peak reflectivity of EUV light exceeds 0.6% and as such does not satisfy the required value relating to in-plane uniformity of the peak reflectivity i.e. its range (the difference between the maximum value and the minimum value of the peak reflectivity) being within 0.6%, which is the technical level at the time of filing of Patent Document 4.

In Patent Document 4, at least one layer among the respective layers (low refractive index layers and high refractive index layers) constituting the multilayer reflective film is made to be a reflectivity distribution correction layer having a thickness distribution provided in a radial direction from the center of the substrate, to suppress the in-plane distribution of the peak reflectivity of EUV light i.e. the in-plane distribution such that the peak reflectivity of EUV light lowers from the center of the substrate towards the peripheral portion of the substrate. Therefore, in the reflectivity distribution correction layer, thickness distribution is provided so that the peak reflectivity of EUV light increases from the center of the substrate towards the peripheral portion of the substrate.

In this specification, the peripheral portion of the substrate is meant for a peripheral portion of a region (an optical property evaluation region) for evaluation of an optical property of the multilayer reflective film, such as the peak reflectivity of EUV light or the center wavelength of reflected light in the EUV wavelength region. For example, in the case of a substrate of a 152 mm square, its optical property evaluation region is a region of a 142 mm square. The corner portions of this region of a 142 mm square are located in the vicinity of 100 mm in a radial direction from the center of the substrate, and therefore, the peripheral portion of the substrate is located in the vicinity of 100 mm in a radial direction from the center of the substrate.

Figure 3:
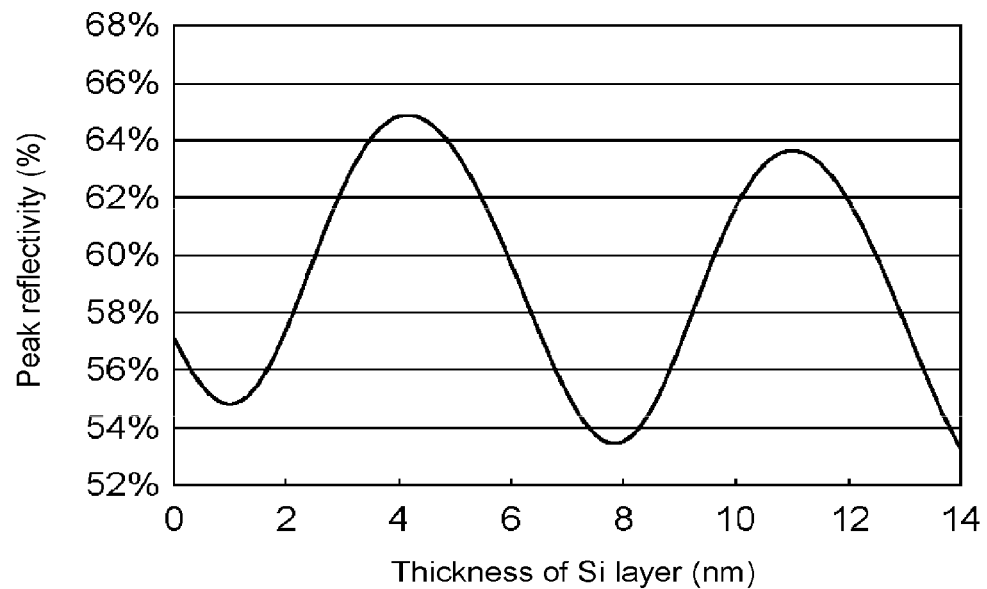
FIG. 3 is a graph showing the relation between the thickness of the uppermost Si layer in a Mo/Si multilayer reflective film and the peak reflectivity of light in the EUV wavelength region at the surface of the Mo/Si multilayer reflective film.

In Patent Document 4, the reason as to why at least one layer among the respective layers (low refractive index layers and high refractive index layers) constituting the multilayer reflective film is made to be a reflectivity distribution correction layer having a thickness distribution provided in a radial direction from the center of the substrate, for the above mentioned purpose of suppressing the in-plane distribution of the peak reflectivity of EUV light, is that, as shown in FIG. 3, the peak reflectivity of EUV light at the surface of the multilayer reflective film, has a dependency on the thickness of each layer (a low refractive index layer or a high refractive index layer) constituting the multilayer reflective film.

FIG. 3 is a graph showing the relation between the thickness of a Si layer as the outermost layer among the respective layers constituting the Mo/Si multilayer reflective film, and the peak reflectivity of EUV light at the surface of the Mo/Si multilayer reflective film.

As shown in FIG. 3, the peak reflectivity of EUV light at the surface of the Mo/Si multilayer reflective film, has a dependency on the thickness of the Si layer, and repeats rise and fall periodically between the local maximum value and the local minimum value. In FIG. 3, the relation between the thickness of a Si layer as the outermost layer among the respective layers constituting the Mo/Si multilayer reflective film and the peak reflectivity of EUV light at the surface of the Mo/Si multilayer reflective film, is shown, but the peak reflectivity of EUV light at the surface of the Mo/Si multilayer reflective film also has a dependency on the thickness of a Si layer other than the outermost layer and repeats rise and fall periodically between the local maximum value and the local minimum value. The peak reflectivity of EUV light at the surface of the Mo/Si multilayer reflective film also has a dependency on the thickness of a Mo layer and repeats rise and fall periodically between the local maximum value and the local minimum value. Further, the peak reflectivity of EUV light at the surface of the Mo/Si multilayer reflective film also has a dependency on the total thickness of Si layers and Mo layers and repeats rise and fall periodically between the local maximum value and the local minimum value.

Further, in FIG. 3, with respect to a Mo/Si multilayer reflective film, the relation between the thickness of the Si layer as the uppermost layer and the peak reflectivity of EUV light at the surface of the Mo/Si multilayer reflective film, is shown, but also in a multilayer reflective film wherein the above-mentioned low refractive index layer and high refractive index layer are different from the Mo/Si multilayer reflective film, or one wherein a diffusion preventive layer is formed between the low refractive index layer and the high refractive index layer of the multilayer reflective film, the peak reflectivity of EUV light at the surface of the multilayer reflective film, has a dependency on the thickness of each layer (a low refractive index layer or a high refractive index layer) constituting the multilayer reflective film.

In Patent Document 4, in order to suppress the above-mentioned in-plane distribution of the peak reflectivity of EUV light i.e. the in-plane distribution wherein the peak reflectivity of EUV light lowers from the center of the substrate towards the peripheral portion of the substrate, at least one layer among the respective layers (low refractive index layers and high refractive index layers) constituting the multilayer reflective film, is made to be a reflectivity distribution correction layer having a thickness distribution provided to increase the peak reflectivity in a radial direction from the center of the substrate (in other words, a thickness distribution so that the peak reflectivity lowers from the peripheral portion towards the center of the substrate).

The thickness distribution to increase the peak reflectivity in a radial direction from the center of the substrate may be set based on the above-mentioned in-plane distribution of the peak reflectivity at the surface of the multilayer reflective film and the above-mentioned thickness dependency in the layer being the reflectivity distribution correction layer (the thickness dependency shown in FIG. 3 in a case where the Si layer as the uppermost layer of the Mo/Si multilayer reflective film is made to be the reflectivity distribution correction layer).

In Patent Document 4, in order to provide a thickness distribution to lower the peak reflectivity of EUV light from the peripheral portion of a substrate towards the center of the substrate, the thickness of the reflectivity distribution correction layer at the peripheral portion of the substrate is made to be in the vicinity of the thickness at which the peak reflectivity of EUV light becomes to have a local maximum value. In Example 1 in Patent Document 4 (Comparative Example 1 in the present invention), the thickness of the reflectivity distribution correction layer (the Si layer as the uppermost layer in the Mo/Si multilayer reflective film) at the peripheral portion of the substrate is made to be 4.5 nm based on FIG. 3.

And, Patent Document 4 discloses to provide a thickness distribution in a radial direction so that the thickness of the reflectivity distribution correction layer increases or decreases towards the center of the substrate.

As mentioned above, in the case of Comparative Example 1 in Patent Document 4 (before correction in the present invention), the amount of decrease in the peak reflectivity from the center towards the peripheral portion of the substrate (the amount of decrease in the peak reflectivity to the maximum value of the peak reflectivity) as derived from the in-plane distribution of the peak reflectivity shown in FIGS. 6, 8, 10, 12, 14 and 16 becomes to be about 0.6%.

Figure 5:
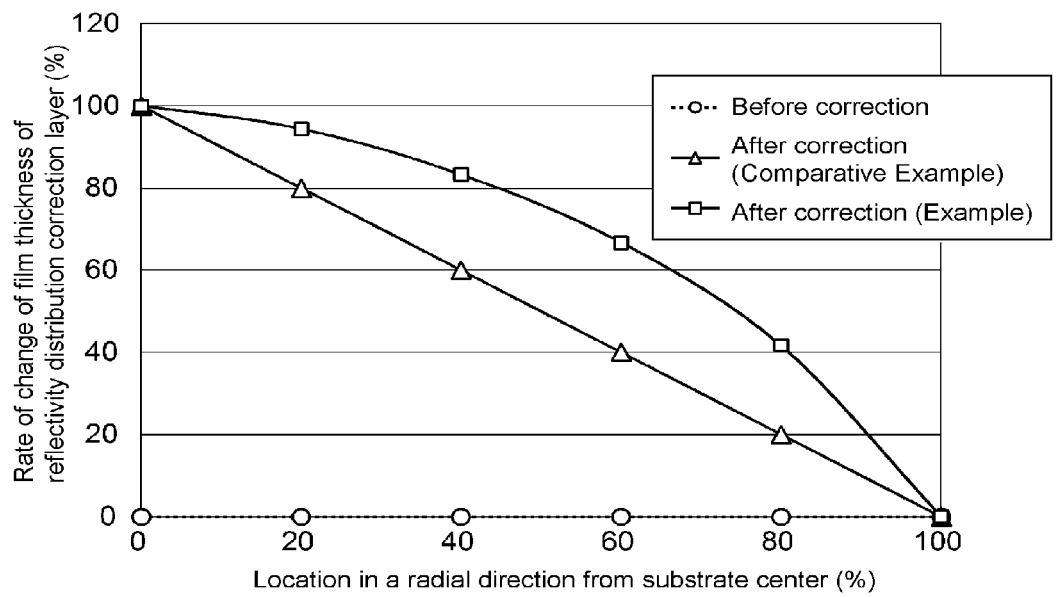
FIG. 5 is a graph showing the relation between the location in a radial direction from the center of the substrate and the rate of change of the thickness of the reflectivity distribution correction layer in Example 1-1 and Comparative Example 1, together with the state before correction.
Figure 9:
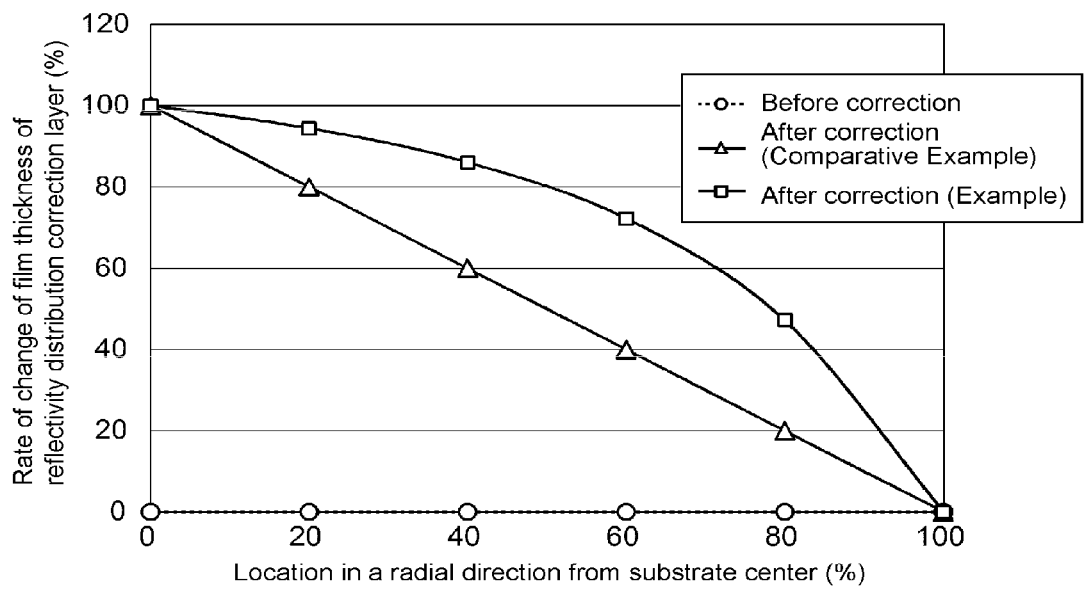
FIG. 9 is a graph showing the relation between the location in a radial direction from the center of the substrate and the rate of change of the thickness of the reflectivity distribution correction layer in Example 2 and Comparative Example 2, together with the state before correction.
Figure 11:
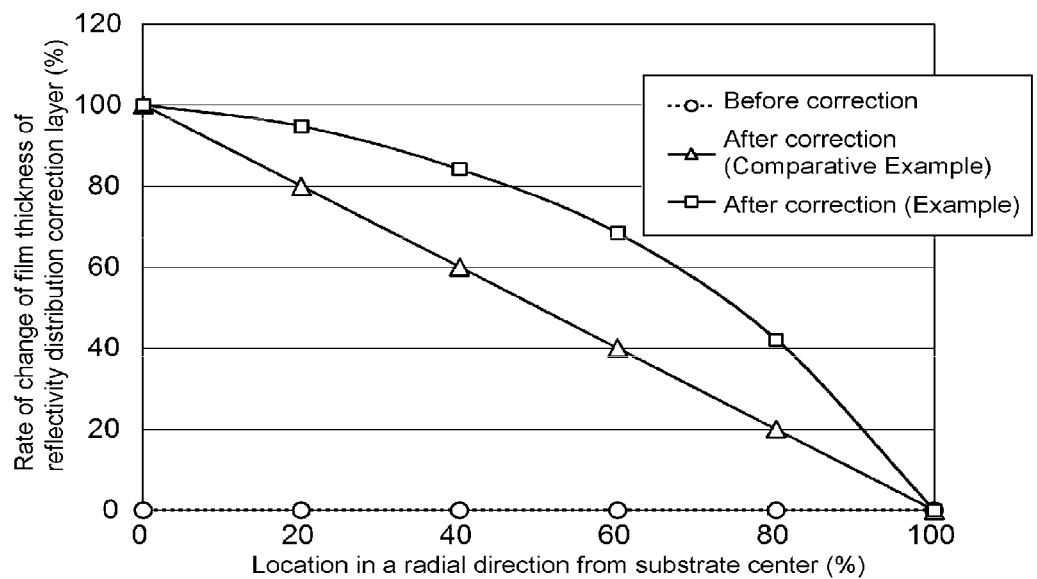
FIG. 11 is a graph showing the relation between the location in a radial direction from the center of the substrate and the rate of change of the thickness of the reflectivity distribution correction layer in Example 3 and Comparative Example 3, together with the state before correction.

Accordingly, in Patent Document 4, the thickness at the center of the substrate is set so that the amount of decrease in the peak reflectivity to the local maximum value of the peak reflectivity shown in FIG. 3 would be about 0.6%, and in Example 1 in Patent Document 4 (Comparative Example 1 in the present invention), a thickness distribution is provided in a radial direction so that the thickness of the Si layer as the uppermost layer of the Mo/Si multilayer reflective film at the peripheral portion of the substrate would be 4.5 nm and the thickness of the Si layer as the uppermost layer of the Mo/Si multilayer reflective film at the center of the substrate would be 4.9 nm. With such a thickness distribution, the rate of change of the thickness in a radial direction is substantially constant as shown in FIGS. 5, 9 and 11 (after correction (Comparative Example)).

However, as shown in Example 1 in Patent Document 4 (Comparative Example 1 in the present invention), if the rate of change of the thickness in a radial direction is substantially constant, it can't be satisfied that the above required value of the in-plane uniformity of the peak reflectivity of EUV light in the present invention i.e. its range (the difference between the maximum value and the minimum value of the peak reflectivity) is within 0.18%.

Whereas in the present invention, among the respective layers constituting the multilayer reflective film, at least one layer of at least one pair of adjacent low refractive index layer and high refractive index layer is made to be a reflectivity distribution correction layer, and the reflectivity distribution correction layer has a thickness distribution which satisfies the following formula (1) in a radial direction from the center of the substrate. Thus, the above-described required value (within 0.18%) of the in-plane uniformity of the peak reflectivity of EUV light is satisfied.

$$-0.011x^2+0.1x-100-\alpha \leq y \leq -0.011x^2+0.1x+100+\alpha \quad (1)$$

wherein x is a location in a radial direction from the center of the substrate represented by the relative value where the center of the film-forming surface on the substrate on which the reflective layer is to be formed, is 0%, and the outer edge at the reflectivity measurement position farthest from the center on the film-forming surface, is 100%; y is the amount of change of the thickness of the reflectivity distribution correction layer represented by the rate of change where the minimum value of the thickness of the reflectivity distribution correction layer is 0%, and the maximum value of the thickness of the reflectivity distribution correction layer is 100%; and α is 25, preferably 20, more preferably 15, further preferably 10.

As described above, in the present invention, among the respective layers constituting the multilayer reflective film, at least one pair of adjacent low refractive index layer and high refractive index layer is made to be a reflectivity distribution correction layer, and the reflectivity distribution correction layer has a thickness distribution which satisfies the above formula (1) in a radial direction from the center of the substrate. In other words, at least one bilayer constituting the multilayer reflective film is made to be a reflectivity distribution correction layer having a thickness distribution which satisfies the above formula (1) in a radial direction from the center of the substrate.

Here, a means to accomplish the thickness distribution of the reflectivity distribution correction layer which satisfies the above formula (1) is not particularly limited, and the thickness distribution may be accomplished by a thickness distribution of the low refractive index layer constituting the reflectivity distribution correction layer, by a thickness distribution of the high refractive index layer constituting the reflectivity distribution correction layer, or by a total thickness distribution of the low refractive index layer and the high refractive index layer constituting the reflectivity distribution correction layer.

In a case where two or more bilayers constituting the multilayer reflective film are made to be a reflectivity distribution correction layer, the average value of the thickness distributions in a radial direction from the center of the substrate of the two or more bilayers constituting the reflectivity distribution correction layer satisfies the above formula (1).

In order to provide a thickness distribution to the low refractive index layer and/or the high refractive index layer constituting the reflectivity distribution correction layer, the incident angle α of sputtered particles 20 to the normal line H at the time of spin film formation as shown in FIG. 2 is properly adjusted. In the after-mentioned Examples, the incident angle α is adjusted within a range of from 0° to 60° to achieve a desired thickness distribution, and the in-plane distribution of the peak reflectivity of EUV light being at most 0.18% is confirmed.

However, in the case of a Mo/Si multilayer reflective film, the thickness distribution of the reflectivity distribution correction layer satisfies the above formula (1) preferably by the thickness distribution of the Si layer among the Mo layer and the Si layer constituting the bilayer. With respect to the thickness of the respective layers constituting the Mo/Si multilayer reflective film, the Si layer is thicker than the Mo layer, as shown in the above-mentioned one construction example (Mo layer (2.5 nm), Si layer (4.5 nm)). The reason is that such a combination is preferred as the y ratio (the ratio of the Si layer to the cycle length) to increase the peak reflectivity of EUV light. And, the thickness distribution of the Si layer having a larger thickness can more easily be adjusted within a control range of the film-forming apparatus.

Further, in a case where the bilayer on the uppermost side of the Mo/Si multilayer reflective film is made to be a reflectivity distribution correction layer, and when the thickness distribution of the reflectivity distribution correction layer satisfies the above formula (1) by a thickness distribution of the Si layer constituting the bilayer, a thickness distribution is provided on the uppermost Si layer in the Mo/Si multilayer reflective film. That is, it is only required to change a condition such as the incident angle of sputtered particles from the condition for film formation of other Si layers, only at the time of the final film formation in the sputtering process, whereby there is a merit in that the film-form ing process will not be cumbersome.

Here, among the respective layers constituting the multilayer reflective film, the low refractive index layer and the high refractive index layer constituting the reflectivity distribution correction layer are one exception to the above-mentioned one construction example of a low refractive index layer (Mo layer) and a high refractive index layer (Si layer) ((2.5 nm) and (4.5 nm)).

Among the plurality of bilayers constituting the multilayer reflective film, only one bilayer may be made to be a reflectivity distribution correction layer, or two or more bilayers may be made to be a reflectivity distribution correction layer. However, the number of bilayers to be a reflectivity distribution correction layer is preferably at most 2, from such a reason that if there are three or more bilayers to be a reflectivity distribution correction layer, the change of the reflectivity is large relative to the change of the film thickness, and it tends to be difficult to control the reflectivity distribution correction.

The peak reflectivity of EUV light at the surface of the multilayer reflective film more significantly changes in many cases when a bilayer closer to the surface of the multilayer reflective film among a plurality of bilayers constituting the multilayer reflective film is made to be a reflectivity distribution correction layer having a thickness distribution which satisfies the formula (1). Accordingly, it is preferred that a bilayer within 20 bilayers from the uppermost layer of the multilayer reflective film, i.e. a bilayer with a stacked number of bilayer of the low refractive index layer and the high refractive index layer being at most 20, is made to be a reflectivity distribution correction layer having a thickness distribution which satisfies the following formula (1), and more preferably a bilayer with a stacked number of bilayer being at most 10, further preferably at most 5, is made to be a reflectivity distribution correction layer having a thickness distribution which satisfies the formula (1).

Here, in the case of the Mo/Si multilayer reflective film, the stacked number of bilayer of the Mo layer and the Si layer is from 30 to 60 as described above.

The protective layer 13 is provided for the purpose of protecting the reflective layer 12, so that at the time of forming a pattern in an absorber layer 14 by an etching process, specifically a dry etching process employing a chlorine-type gas as an etching gas, the reflective layer 12 will not be damaged by the etching process. Accordingly, as the material for the protective layer 13, a material hardly susceptible to an influence by the etching process of the absorber layer 14 i.e. having an etching rate slower than the absorber layer 14 and hardly susceptible to damage by such an etching process, is selected for use.

Further, the protective layer 13 is preferably configured such that the protective layer 13 itself also has a high EUV light reflectivity in order not to impair the EUV light reflectivity at the reflective layer 12 even after forming the protective layer 13.

In the present invention, in order to satisfy the above conditions, as the protective layer 13, a Ru layer or a Ru compound layer is formed. The Ru compound is preferably constituted by at least one member selected from the group consisting of RuB, RuNb and RuZr. In a case where the protective layer 13 is a Ru compound layer, the content of Ru is preferably at least 50 at %, more preferably at least 80 at %, particularly preferably at least 90 at %. However, in a case where the protective layer 13 is a RuNb layer, the content of Nb in the protective layer 13 is preferably from 5 to 40 at %, particularly preferably from 5 to 30 at %.

In a case where a protective layer 13 is formed on the reflective layer 12, the Root Mean Square Roughness of the protective layer 13 surface is preferably at most 0.5 nm. If the Root Mean Square Roughness of the protective layer 13 surface is large, the surface roughness of the absorber layer 14 to be formed on the protective layer 13 tends to be large, whereby the edge roughness of a pattern to be formed on the absorber layer 14 tends to be large, and the dimensional precision of a pattern tends to be poor. As the pattern becomes fine, the influence of the edge roughness becomes distinct, and therefore, it is required that the absorber layer 14 surface is smooth.

When the Root Mean Square Roughness of the protective layer 13 surface is at most 0.5 nm, the surface of the absorber layer 14 to be formed on the protective layer 13 will be sufficiently smooth, thus being free from deterioration of the dimensional precision of a pattern due to an influence of the edge roughness. The Root Mean Square Roughness of the protective layer 13 surface is more preferably at most 0.4 nm, further preferably at most 0.3 nm.

In a case where the protective layer 13 is formed on the reflective layer 12, the thickness of the protective layer 13 is preferably from 1 to 10 nm in that it is thereby possible to increase the EUV light reflectivity and to obtain an etching resistance property. The thickness of the protective layer 13 is more preferably from 1 to 5 nm, further preferably from 2 to 4 nm.

Further, in a case where the protective layer 13 is formed on the reflective layer (multilayer reflective film) 12, the above mentioned thickness distribution in a radial direction from the center of the substrate is provided to at least one layer among the protective layer and the respective layers (low refractive index layers and high refractive index layers) constituting the multilayer reflective film. Therefore, the above thickness distribution may be provided to only the Ru layer or the Ru compound layer formed as the protective layer 13. Otherwise, the above thickness distribution may be provided to both of the Ru layer or the Ru compound layer, and the respective layers (low refractive index layers and high refractive index layers) constituting the multilayer reflective film.

However, in a case where the reflective layer 12 is a Mo/Si multilayer reflective film, it is preferred to make the thickness of a Si layer larger than the thickness of the Ru layer or the Ru compound layer formed as the protective layer 13, in order to increase the EUV light reflectivity, and therefore, also in a case where the protective layer 13 is formed on the reflective layer (Mo/Si multilayer reflective film) 12, it is preferred to provide the thickness distribution to a Si layer constituting the Mo/Si multilayer reflective film.

In the case of forming the protective layer 13 on the reflective layer 12, the protective layer 13 is formed by means of a sputtering method such as a magnetron sputtering method or an ion beam sputtering method.

In a case where a Ru layer is to be formed as the protective layer 13 by means of an ion beam sputtering method, discharge may be made in an inert gas atmosphere containing at least one of helium (He), argon (Ar), neon (Ne), krypton (Kr) and xenon (Xe) by using a Ru target as the target. Specifically, the ion beam sputtering may be carried out under the following conditions.

Sputtering gas: Ar (gas pressure: from $1.3\times10^{-2}$ Pa to $2.7\times10^{-2}$ Pa)

Ion accelerating voltage: from 300 to 1,500 V

Film forming rate: from 1.8 to 18.0 nm/min

Here, also in a case where an inert gas other than Ar is used, the above gas pressure applies.

Further, the state before forming the absorber layer of the reflective mask blank for EUVL of the present invention, i.e. the structure having the absorber layer 14 excluded from the reflective mask blank 1 for EUVL shown in FIG. 1, is a substrate with reflective layer for EUVL of the present invention. The substrate with reflective layer for EUVL of the present invention is one constituting a precursor for a reflective mask blank for EUVL. However, the substrate with reflective layer for EUVL of the present invention is not limited to a precursor for a reflective mask blank for EUVL and may generally be useful as an optical substrate having a function to reflect EUV light.

In the substrate with reflective layer for EUVL of the present invention, at least one bilayer constituting the multilayer reflective film is a reflectivity distribution correction layer having a thickness distribution which satisfies the above formula (1) in a radial direction from the center of the substrate.

In a case where a protective layer is formed on the reflective layer, at least one bilayer constituting the multilayer reflective film is a reflectivity distribution correction layer having a thickness distribution which satisfies the above formula (1) in a radial direction from the center of the substrate.

The property particularly required for the absorber layer 14 is that the EUV light reflectivity is very low. Specifically, the maximum light reflectivity in the vicinity of a wavelength of 13.5 nm at the time of irradiating the surface of the absorber layer 14 with a light ray in the wavelength region of EUV light, is preferably at most 0.5%, more preferably at most 0.1%.

In order to attain the above property, the absorber layer 14 is preferably made of a material having a high absorption coefficient of EUV light and is preferably a layer containing at least Ta and N.

Further, the absorber layer 14 being a layer containing at least Ta and N is preferred also from such a viewpoint that it is thereby easy to form a film having a crystalline state being amorphous.

As the layer containing at least Ta and N, it is preferred to employ one member selected from the group consisting of TaN, TaNH, TaBN, TaGaN, TaGeN, TaSiN, TaBSiN and PdTaN. Examples of such preferred compositions for the absorber layer are as follows.

TaN Layer

Content of Ta: preferably from 30 to 90 at %, more preferably from 40 to 80 at %, further preferably from 40 to 70 at %, particularly preferably from 50 to 70 at %

Content of N: preferably from 10 to 70 at %, more preferably from 20 to 60 at %, further preferably from 30 to 60 at %, particularly preferably from 30 to 50 at %

TaNH Layer

Total content of Ta and N: preferably from 50 to 99.9 at %, more preferably from 90 to 98 at %, further preferably from 95 to 98 at %

Content of H: preferably from 0.1 to 50 at %, more preferably from 2 to 10 at %, further preferably from 2 to 5 at %

Compositional ratio of Ta to N (Ta:N): preferably from 9:1 to 3:7, more preferably from 7:3 to 4:6, further preferably from 7:3 to 5:5

TaBN Layer

Total content of Ta and N: preferably from 75 to 95 at %, more preferably from 85 to 95 at %, further preferably from 90 to 95 at %

Content of B: preferably from 5 to 25 at %, more preferably from 5 to 15 at %, further preferably from 5 to 10 at %

Compositional ratio of Ta to N (Ta:N): preferably from 9:1 to 3:7, more preferably from 7:3 to 4:6, further preferably from 7:3 to 5:5

TaBSiN Layer

Content of B: at least 1 at % and less than 5 at %, preferably from 1 to 4.5 at %, more preferably from 1.5 to 4 at %

Content of Si: from 1 to 25 at %, preferably from 1 to 20 at %, more preferably from 2 to 12 at %

Compositional ratio of Ta to N (Ta:N): from 8:1 to 1:1

Content of Ta: preferably from 50 to 90 at %, more preferably from 60 to 80 at %

Content of N: preferably from 5 to 30 at %, more preferably from 10 to 25 at %

PdTaN Layer

Total content of Ta and N: preferably from 30 to 80 at %, more preferably from 30 to 75 at %, further preferably from 30 to 70 at %

Content of Pd: preferably from 20 to 70 at %, more preferably from 25 to 70 at %, further preferably from 30 to 70 at %

Compositional ratio of Ta to N (Ta:N): preferably from 1:7 to 3:1, more preferably from 1:3 to 3:1, further preferably from 3:5 to 3:1

As mentioned above, if the Root Mean Square Roughness of the absorber layer 14 surface is large, the edge roughness of a pattern to be formed on the absorber layer 14 tends to be large, and the dimensional precision of a pattern deteriorates. As the pattern becomes fine, the influence of the edge roughness becomes distinct, and therefore, the absorber layer 14 surface is required to be smooth.

In a case where a layer containing at least Ta and N is formed as the absorber layer 14, its crystal state is amorphous, and the surface smoothness is excellent. Specifically when a TaN layer is formed as the absorber layer 14, the Root Mean Square Roughness of the absorber layer 14 surface becomes to be at most 0.5 nm.

When the Root Mean Square Roughness of the absorber layer 14 surface is at most 0.5 nm, the absorber layer 14 surface is sufficiently smooth, whereby the dimensional precision of a pattern is free from deterioration due to an influence of an edge roughness. The Root Mean Square Roughness of the absorber layer 14 surface is more preferably at most 0.4 nm, further preferably at most 0.3 nm.

As a layer containing at least Ta and N, the absorber layer 14 has a high etching rate at the time when dry etching is carried out by using a chlorine-type gas as the etching gas, and shows its etching selectivity to the protective layer 13 being at least 10. In this specification, the etching selectivity can be calculated by the following formula.

Etching selectivity=(etching rate of absorber layer 14)/(etching rate of protective layer 13)

The etching selectivity is preferably at least 10, more preferably at least 11, particularly preferably at least 12.

The thickness of the absorber layer 14 is preferably at least 5 nm, more preferably at least 20 nm, further preferably at least 30 nm, particularly preferably at least 50 nm.

On the other hand, if the thickness of the absorber layer 14 is too large, the precision of a pattern to be formed in the absorber layer 14 tends to be low, and therefore, it is preferably at most 100 nm, more preferably at most 90 nm, further preferably at most 80 nm.

For the absorber layer 14, it is possible to use a well-known film-forming method, e.g. a sputtering method such as a magnetron sputtering method or an ion beam sputtering method.

In a case where a TaN layer is to be formed as the absorber layer 14, in the case of using a magnetron sputtering method, the TaN layer may be formed by using a Ta target and letting the target discharge in a nitrogen ($N_2$) atmosphere diluted by Ar.

In order to form a TaN layer as the absorber layer 14 by the above-exemplified method, specifically the method may be carried out under the following film-forming conditions.

Sputtering gas: mixed gas of Ar and $N_2$ ($N_2$ gas concentration: from 3 to 80 vol %, preferably from 5 to 30 vol %, more preferably from 8 to 15 vol %; gas pressure: from $0.5 \times 10^{-1}$ Pa to $10 \times 10^{-1}$ Pa, preferably from $0.5 \times 10^{-1}$ Pa to $5 \times 10^{-1}$ Pa, more preferably from $0.5 \times 10^{-1}$ Pa to $3 \times 10^{-1}$ Pa)

Applied power (for each target): from 30 to 1,000 W, preferably from 50 to 750 W, more preferably from 80 to 500 W Film forming rate: from 2.0 to 60 nm/min, preferably from 3.5 to 45 nm/min, more preferably from 5 to 30 nm/min.

Further, the reflective mask blank for EUVL of the present invention may have a constituting element other than the construction shown in FIG. 1 (i.e. the substrate 11, the reflective layer 12, the protective layer 13 and the absorber layer 14).

Figure 4:
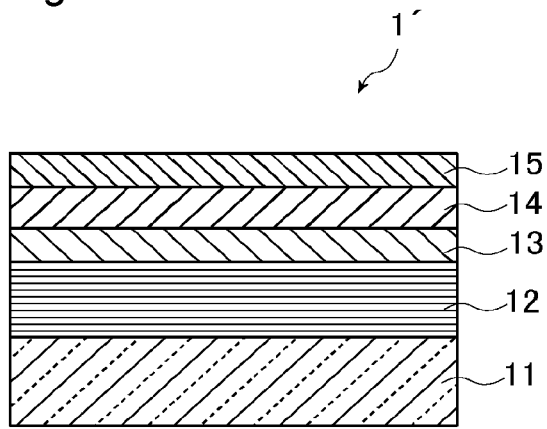
FIG. 4 is a schematic cross-sectional view illustrating another embodiment of the reflective mask blank for EUVL to be produced by the process of the present invention.

FIG. 4 is a schematic cross-sectional view illustrating another embodiment of the reflective mask blank for EUVL of the present invention.

In the reflective mask blank 1' for EUVL as shown in FIG. 4, a low reflective layer 15 for inspection light to be used for inspection of a mask pattern is formed on the absorber layer 14.

In the preparation of a reflective mask for EUVL from the reflective mask blank for EUVL of the present invention, after forming a pattern in the absorber layer, inspection is carried out to see that this pattern is formed as designed. In this inspection of the mask pattern, an inspection machine using light of usually 257 nm as inspection light, is employed. That is, the inspection is made by the difference in reflectivity of such light of about 257 nm, specifically by the difference in the reflectivity between a surface exposed by removal of the absorber layer 14 by patterning and the surface of the absorber layer 14 remained without being removed by the patterning. Here, the former is the surface of the protective layer 13, and in a case where no protective layer 13 is formed on the reflective layer 12, it is the surface of the reflective layer 12 (specifically the surface of a Si layer as the uppermost layer of the Mo/Si multilayer reflective film).

Therefore, if the difference in the reflectivity between the protective layer 13 surface (or the reflective layer 12 surface) and the absorber layer 14 surface to the wavelength of inspection light of about 257 nm, is small, the contrast at the time of the inspection becomes poor, and an accurate inspection may not be possible.

The absorber layer 14 having the above-described construction has an extremely low EUV light reflectivity and has excellent properties as an absorber layer for a reflective mask blank for EUVL, but from the viewpoint of the wavelength of inspection light, the light reflectivity may not necessarily be sufficiently low. As a result, the difference between the reflectivity at the surface of the absorber layer 14 and the reflectivity at the surface of the reflective layer 12 (or the surface of the protective layer 13) at the wavelength of inspection light, tends to be small, and the contrast at the time of inspection may not sufficiently be obtainable. If the contrast at the time of inspection cannot be sufficiently obtained, a defect in the pattern cannot be sufficiently detected in the inspection of a mask, and an accurate inspection of a defect may not be carried out.

Like in the reflective mask blank 1' for EUVL shown in FIG. 4, by forming a low reflective layer 15 on the absorber layer 14, the contrast at the time of inspection will be good. In other words, the light reflectivity at the wavelength of inspection light becomes very low. With the low reflective layer 15 to be formed for such a purpose, the maximum light reflectivity at the wavelength of inspection light when irradiated with light in the wavelength region (in the vicinity of 257 nm) of inspection light, is preferably at most 15%, more preferably at most 10%, further preferably at most 5%.

When the light reflectivity at the wavelength of inspection light at the low reflective layer 15 is at most 15%, the contrast at the time of the inspection will be good. Specifically, the contrast between reflected light with a wavelength of the inspection light at the surface of the protective layer 13 (or the surface of the reflective layer 12) and reflected light with the wavelength of the inspection light at the surface of the low reflective layer 15 becomes at least 40%.

In this specification, the contrast is obtained by using the following formula.

$$\text{Contrast (\%)} = ((R_2 - R_1)/(R_2 + R_1)) \times 100$$

Here, $R_2$ at the wavelength of the inspection light is the reflectivity at the surface of the protective layer 13 (or the surface of the reflective layer 12), and $R_1$ is the reflectivity at the surface of the low reflective layer 15. Here, the above $R_1$ and $R_2$ are measured in such a state that a pattern is formed in the absorber layer 14 and the low reflective layer 15 of the reflective mask blank 1' for EUVL shown in FIG. 4. The above $R_2$ is a value measured at the surface of the protective layer 13 (or the surface of the reflective layer 12) exposed as the absorber layer 14 and the low reflective layer 15 were removed by patterning, and $R_1$ is a value measured at the surface of the low reflective layer 15 remained without being removed by patterning.

In the present invention, the contrast represented by the above formula is more preferably at least 45%, further preferably at least 60%, particularly preferably at least 70%.

To attain the above-described properties, the low reflective layer 15 is preferably constituted by a material having a refractive index lower than the absorber layer 14 at the wavelength of inspection light, and its crystal state is preferably amorphous.

As a specific example of such a low reflective layer 15, one containing Ta, oxygen (O) and nitrogen (N) in the following atomic ratio (low reflective layer (TaON)) may be mentioned.

Content of Ta: from 20 to 80 at %, preferably from 20 to 70 at %, more preferably from 20 to 60 at %

Total content of O and N: from 20 to 80 at %, preferably from 30 to 80 at %, more preferably from 40 to 80 at %

Compositional ratio of O to N (O:N): from 20:1 to 1:20, preferably from 18:1 to 1:18, more preferably from 15:1 to 1:15

With the above-described construction, the low reflective layer (TaON) is amorphous in its crystal state and is excellent in its surface smoothness. Specifically, the Root Mean Square Roughness of the low reflective layer (TaON) surface is at most 0.5 nm.

As mentioned above, in order to prevent deterioration in the dimensional precision of a pattern due to an influence of the edge roughness, it is required that the absorber layer 14 surface is smooth. The low reflective layer 15 is formed on the absorber layer 15, and therefore, for the same reason, its surface is required to be smooth.

When the Root Mean Square Roughness of the low reflective layer 15 surface is at most 0.5 nm, the low reflective layer 15 surface is sufficiently smooth and free from deterioration in the dimensional precision of a pattern due to an influence of the edge roughness. The Root Mean Square Roughness of the low reflective layer 15 surface is more preferably at most 0.4 nm, further preferably at most 0.3 nm.

In a case where the low reflective layer 15 is formed on the absorber layer 14, the total thickness of the absorber layer 14 and the low reflective layer 15 is preferably from 20 to 130 nm. Further, if the thickness of the low reflective layer 15 is more than the thickness of the absorber layer 14, the EUV absorbing property at the absorber layer 14 is likely to be low, and therefore, the thickness of the low reflective layer 15 is preferably less than the thickness of the absorber layer 14. For this reason, the thickness of the low reflective layer 15 is preferably from 5 to 30 nm, more preferably from 10 to 20 nm.

The low reflective layer (TaON) having the above construction may be formed by a sputtering method such as a magnetron sputtering method or an ion beam sputtering method by using a Ta target in an atmosphere of oxygen ($O_2$) and nitrogen ($N_2$) diluted with an inert gas containing at least one of helium (He), argon (Ar), neon (Ne), krypton (Kr) and xenon (Xe). Otherwise, a Ta target may be discharged in a nitrogen ($N_2$) atmosphere diluted with an inert gas containing at least one of helium (He), argon (Ar), neon (Ne), krypton (Kr) and xenon (Xe) to form a film containing Ta and N, and then the formed film is oxidized by e.g. being exposed to oxygen plasma or being irradiated with an ion beam using oxygen, to obtain the low reflective layer (TaON) having the above construction.

In order to form the low reflective layer (TaON) by the above method, specifically the following film-forming conditions may be employed.

Sputtering gas: mixed gas of Ar, $O_2$ and $N_2$ ($O_2$ gas concentration: from 5 to 80 vol %, $N_2$ gas concentration: from 5 to 75 vol %, preferably $O_2$ gas concentration: from 6 to 70 vol %, $N_2$ gas concentration: from 6 to 35 vol %, more preferably $O_2$ gas concentration: from 10 to 30 vol %, $N_2$ gas concentration: from 10 to 30 vol %, Ar gas concentration: from 5 to 90 vol %, preferably from 10 to 88 vol %, more preferably from 20 to 80 vol %; gas pressure: from $1.0 \times 10^{-1}$ Pa to $50 \times 10^{-1}$ Pa, preferably from $1.0 \times 10^{-1}$ Pa to $40 \times 10^{-1}$ Pa, more preferably from $1.0 \times 10^{-1}$ Pa to $30 \times 10^{-1}$ Pa)

Applied power: from 30 to 1,000 W, preferably from 50 to 750 W, more preferably from 80 to 500 W Film forming rate: from 0.1 to 50 nm/min, preferably from 0.2 to 45 nm/min, more preferably from 0.2 to 30 nm/min.

Here, in a case where an inert gas other than Ar is used, the concentration of such an inert gas is adjusted to be within the same concentration range as the above Ar gas concentration. Further, in a case where plural types of inert gases are used, the total concentration of such inert gases is adjusted to be within the same concentration range as the above Ar gas concentration.

Here, the reason as to why it is preferred to form a low reflective layer 15 on the absorber layer 14 as in the reflective mask blank 1' for EUVL shown in FIG. 4, is that the wavelength of inspection light for a pattern is different from the wavelength of EUV light. Therefore, in a case where EUV light (in the vicinity of 13.5 nm) is used as the inspection light for a pattern, it is considered unnecessary to form a low reflective layer 15 on the absorber layer 14. The wavelength of inspection light tends to be shifted toward a low wavelength side as the size of a pattern becomes small, and in future, it is considered to be shifted to 193 nm or further to 13.5 nm. Further, in the case where the wavelength of inspection light is 193 nm, it may not be required to form a low reflective layer 15 on the absorber layer 14. In the case where the wavelength of inspection light is 13.5 nm, it is considered unnecessary to form a low reflective layer 15 on the absorber layer 14.

The reflective mask blank for EUVL of the present invention may have a functional film commonly known in the field of a reflective mask blank for EUVL, in addition to the reflective layer 12, the protective layer 13, the absorber layer 14 and the low reflective layer 15. A specific example of such a functional film may, for example, be an electrically conductive coating formed on the rear side of a substrate to promote the electrostatic chucking of the substrate, as disclosed in e.g. JP-A-2003-501823. Here, in the substrate 11 shown in FIG. 1, the rear side of the substrate means the surface on the opposite side to the side where the reflective layer 12 is formed. For the electrically conductive coating to be formed on the rear side of the substrate for such a purpose, the electrical conductivity and the thickness of the constituting material are selected so that the sheet resistance will be at most 100Ω/□. The constituting material of the electrically conductive coating may be selected widely from those disclosed in known literatures. For example, an electrically conductive (high dielectric constant) coating disclosed in JP-A-2003-501823, specifically a coating comprising silicon, TiN, molybdenum, chromium and TaSi may be applied. The thickness of the electrically conductive coating may, for example, be from 10 to 1,000 nm.

The electrically conductive coating may be formed by means of a known film-forming method e.g. a sputtering method, such as a magnetron sputtering method or an ion beam sputtering method, a CVD method, a vacuum vapor deposition method or an electroplating method.

In the reflective mask blank for EUVL of the present invention, at least one bilayer constituting the multilayer reflective film is a reflectivity distribution correction layer having a thickness distribution which satisfies the above formula (1) in a radial direction from the center of the substrate.

Further, in a case where a protective layer is formed on the reflective layer, at least one bilayer constituting the multilayer reflective film is a reflectivity distribution correction layer having a thickness distribution which satisfies the above formula (1) in a radial direction from the center of the substrate.

The reflective mask for EUVL may be produced by patterning at least the absorber layer of the reflective mask blank for EUVL of the present invention (in a case where a low reflective layer is formed on the absorber layer, the absorber layer and the low reflective layer). The method for patterning the absorber layer (in a case where a low reflective layer is formed on the absorber layer, the absorber layer and the low reflective layer), is not particularly limited. For example, a method may be employed wherein a resist is applied on the absorber layer (in a case where a low reflective layer is formed on the absorber layer, the absorber layer and the low reflective layer) to form a resist pattern, and by using it as a mask, the absorber layer (in a case where a low reflective layer is formed on the absorber layer, the absorber layer and the low reflective layer) is subjected to etching. The material for the resist, or the drawing method for the resist pattern may suitably be selected in consideration of e.g. the material of the absorber layer (in a case where a low reflective layer is formed on the absorber layer, the absorber layer and the low reflective layer). As the method for etching the absorber layer (in a case where a low reflective layer is formed on the absorber layer, the absorber layer and the low reflective layer), dry etching using a chlorine-type gas as an etching gas may be employed. After patterning the absorber layer (in a case where a low reflective layer is formed on the absorber layer, the absorber layer and the low reflective layer), the resist is removed by a remover liquid to obtain the reflective mask for EUVL.

EXAMPLES

Now, the present invention will be described in further detail with reference to Examples.

In this Example, a substrate with reflective layer for EUVL is prepared. This substrate with reflective layer for EUVL has a structure having the absorber layer 14 excluded from the mask blank 1 shown in FIG. 1.

Reference Example 1, Before Correction

As a substrate 11 for film formation, a $SiO_2$—$TiO_2$ type glass substrate (size: 6 inches (152 mm) square, thickness: 6.35 mm) is used. The thermal expansion coefficient of this glass substrate is $0.05 \times 10^{-7}$/° C., the Young's modulus is 67 GPa, the Poisson ratio is 0.17, and the specific rigidity is $3.07 \times 10^7$ m²/s². This glass substrate is polished to form a smooth surface having a Root Mean Square Roughness of at most 0.15 nm and a planarity of at most 100 nm.

On the rear surface side of the substrate 11, a Cr film having a thickness of 100 nm is formed by a magnetron sputtering method to provide an electrically conductive coating (not shown in the drawings) having a sheet resistance of 100 Ω/□.

By using the Cr film formed by the above procedure, the substrate 11 (size: 6 inches (152 mm) square, thickness: 6.35 mm) is fixed to a usual electrostatic chuck of a flat plate shape, and on the surface of the substrate 11, by carrying out the spinning film formation as shown in FIG. 2, a Mo film and a Si film are alternately formed by means of an ion beam sputtering method for 40 cycles to form a Mo/Si multilayer reflective film (reflective layer 12) having a total thickness of 280 nm ((2.5 nm+4.5 nm)×40). Here, the uppermost layer of the Mo/Si multilayer reflective film is a Si film. The Mo/Si multilayer reflective layer is formed in a 152 mm square region on the substrate 11 surface.

The film forming conditions for the Mo film and the Si film are as follows.

Film Forming Conditions for Mo Film
  Target: Mo target
  Sputtering gas: mixed gas of Ar and $H_2$ ($H_2$ gas concentration: 3 vol %, Ar gas concentration: 97 vol %, gas pressure: 0.02 Pa)
  Voltage: 700 V
  Film forming rate: 3.84 nm/min.
  Film thickness: 2.5 nm Film Forming Condition for Si Film
  Target: Si target (boron-doped)
  Sputtering gas: mixed gas of Ar and $H_2$ ($H_2$ gas concentration: 3 vol %, Ar gas concentration: 97 vol %, gas pressure: 0.02 Pa)
  Voltage: 700 V
  Film forming rate: 4.62 nm/min.
  Film thickness: 4.5 nm The rate of change of the thickness in a radial direction from the center of the substrate of a bilayer on the uppermost side of the Mo/Si multilayer reflective film formed by the above procedure is shown in FIG. 5 (before correction). In FIG. 5, the location in a radial direction from the center of the substrate, is represented by the relative value where the center of the film-forming surface on the substrate on which the Mo/Si multilayer reflective film is to be formed (hereinafter referred to as "the center of the substrate"), is 0%, and the outer edge at the reflectivity measurement position farthest from the center on the film-forming surface of the substrate (hereinafter referred to as "the outer edge of the substrate"), is 100%. Here, a radius of 100 mm from the center of the substrate in a case where the reflectivity evaluation region is a 142 mm square is taken as 100%. The rate of change of the thickness is represented by the rate of change of the thickness from the thickness at the outer edge of the substrate. The rate of change of the thickness is, if there is any change of the thickness, a relative rate of change of the thickness, where the minimum value of the thickness of the reflectivity distribution correction layer is 0% and the maximum value of the thickness of the reflectivity distribution correction layer is 100%.

As shown by "before correction" (dashed line) in FIG. 5, the thickness of the bilayer on the uppermost side of the Mo/Si multilayer reflective film is constant.

Figure 6:
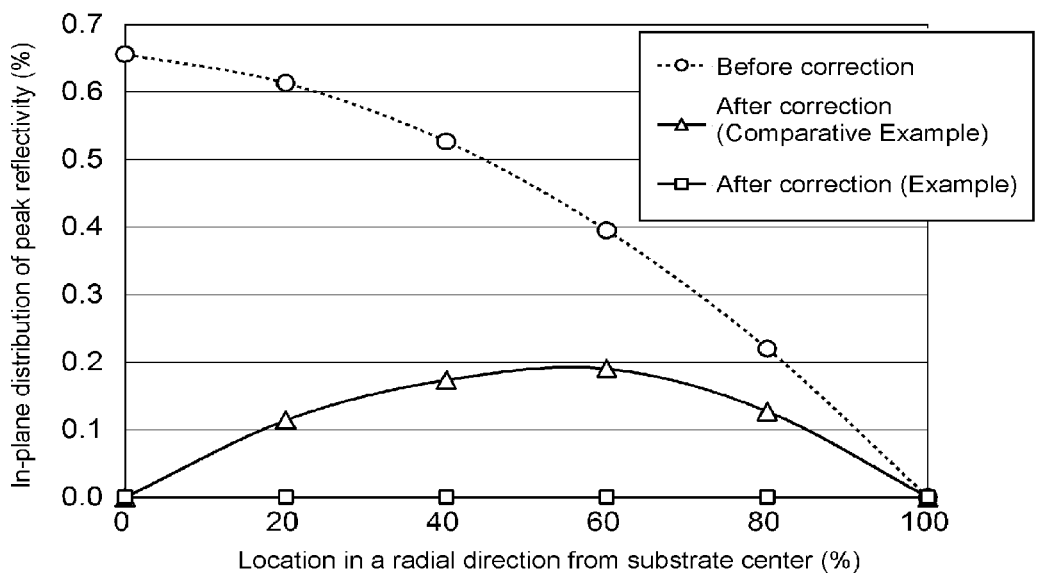
FIG. 6 is a graph showing the relation between the location in a radial direction from the center of the substrate and the in-plane distribution of the peak reflectivity of light in the EUV wavelength region at the surface of a Mo/Si multilayer reflective film in Example 1-1 and Comparative Example 1, together with the state before correction.

The in-plane distribution of the peak reflectivity of reflected light in the EUV wavelength region when the surface of the Mo/Si multilayer reflective film formed by the above procedure is irradiated with EUV light at an incident angle of 6°, is shown in FIG. 6 (before correction).

As shown by "before correction" (dashed line) in FIG. 6, an in-plane distribution is observed such that the peak reflectivity of EUV light lowers from the center of the substrate towards the peripheral portion of the substrate. The in-plane distribution of the peak reflectivity of EUV light exceeds 0.18%, which does not satisfy the required value relating to the in-plane uniformity of the peak reflectivity of EUV light, i.e. its range (the difference between the maximum value and the minimum value of the center wavelength) being within 0.18%.

Comparative Example 1

In this Comparative Example, a Mo/Si multilayer reflective film is formed as a reflective layer 2 on a substrate 11 in the same manner as in Reference Example 1 except that a thickness distribution in a radial direction is provided on a Si layer as an uppermost layer of the Mo/Si multilayer reflective film in the same manner as in Example 1 in Patent Document 4. Specifically as follows.

A film thickness of a reflectivity distribution correction layer (Si layer) at the peripheral portion of a substrate at which the peak reflectivity of EUV light is lowest in Reference Example 1 is made to be 4.49 nm in the vicinity of the thickness at which the peak reflectivity of EUV light has a local maximum value in FIG. 3. Further, at the center of the substrate at which the peak reflectivity is highest in Comparative Example 1, the thickness is 4.85 nm corresponding to an amount of decrease (about 0.6%) of the peak reflectivity of EUV light from the center of the substrate towards the peripheral portion.

In the same manner as in Reference Example 1, the rate of change of the thickness in a radial direction from the center of the substrate of a bilayer on the uppermost side of the Mo/Si multilayer reflective film is shown in FIG. 5 (after correction (Comparative Example)). Here, FIG. 5 (before correction) illustrates the rate of change of the thickness in Reference Example 1.

As shown in FIG. 5 (before correction (Comparative Example)), the rate of change of the thickness in a radial direction is substantially constant.

In the same manner as in Reference Example 1, the in-plane distribution of the peak reflectivity in the EUV wavelength region is shown in FIG. 6 (after correction (Comparative Example)). Further, FIG. 6 (before correction) illustrates the in-plane distribution of the peak reflectivity in Reference Example 1.

As shown in FIG. 6 (after correction (Comparative Example)), an in-plane distribution occurs such that the peak reflectivity of EUV light increases from the center of the substrate towards the vicinity of the middle of the center and the peripheral portion of the substrate, and then the peak reflectivity lowers from the vicinity of the middle towards the peripheral portion of the substrate. The in-plane distribution of the peak reflectivity of EUV light exceeds 0.18%, which does not satisfy the required value relating to the in-plane uniformity of the peak reflectivity of EUV light.

Example 1-1

In this Example, a bilayer on the uppermost side of a Mo/Si multilayer reflective film is made to be a reflectivity distribution correction layer having a thickness distribution which satisfies the above formula (1) in a radial direction from the center of the substrate. Therefore, a thickness distribution is provided on a Si layer constituting the reflectivity distribution correction layer.

In the same manner as in Reference Example 1, the rate of change of the thickness in a radial direction from the center of the substrate in the bilayer on the uppermost side of the Mo/Si multilayer reflective film is shown in FIG. 5 (after correction (Example)).

The approximate expression of the change of the thickness in a radial direction shown in FIG. 5 (after-correction (Example)), is represented by the following formula.

$$y = -0.0101x^2 - 0.04x + 100$$

In the same manner as in Reference Example 1, the in-plane distribution of the peak reflectivity in the EUV wavelength region is shown in FIG. 6 (after correction (Example)).

As shown in FIG. 6 (after correction (Example)), the peak reflectivity of EUV light is constant, and no in-plane distribution occurs.

Example 1-2

In the same manner as in Example 1-1, a bilayer on the uppermost side of a Mo/Si multilayer reflective film is made to be a reflectivity distribution correction layer having a thickness distribution which satisfies the above formula (1) in a radial direction from the center of the substrate. However, a thickness distribution is provided to a Mo layer constituting the reflectivity distribution correction layer.

Figure 7:
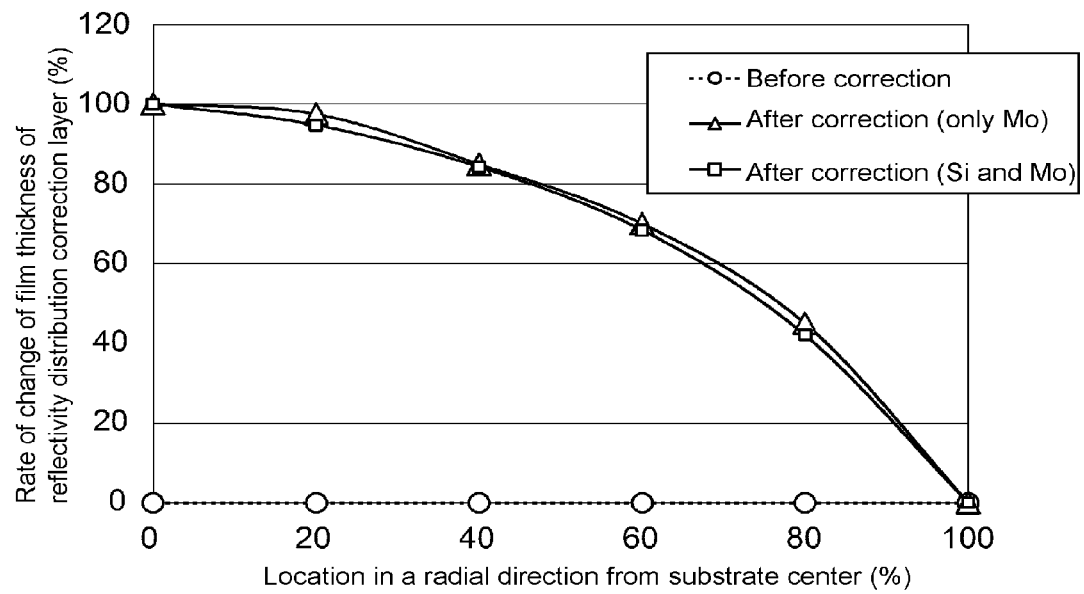
FIG. 7 is a graph showing the relation between the location in a radial direction from the center of the substrate and the rate of change of the thickness of the reflectivity distribution correction layer in Example 1-2 and Example 1-3, together with the state before correction.

In the same manner as in Reference Example 1, the rate of change of the thickness in a radial direction from the center of the substrate of the bilayer on the uppermost side of the Mo/Si multilayer reflective film is shown in FIG. 7 (after correction (only Mo)). Further, FIG. 7 (before correction) illustrates the rate of change of the thickness in Reference Example 1.

The approximate expression of the change of the thickness in a radial direction shown in FIG. 7 (after correction (only Mo)) is represented by the following formula.

$$y=-0.0114x^2+0.16x+100$$

Figure 8:
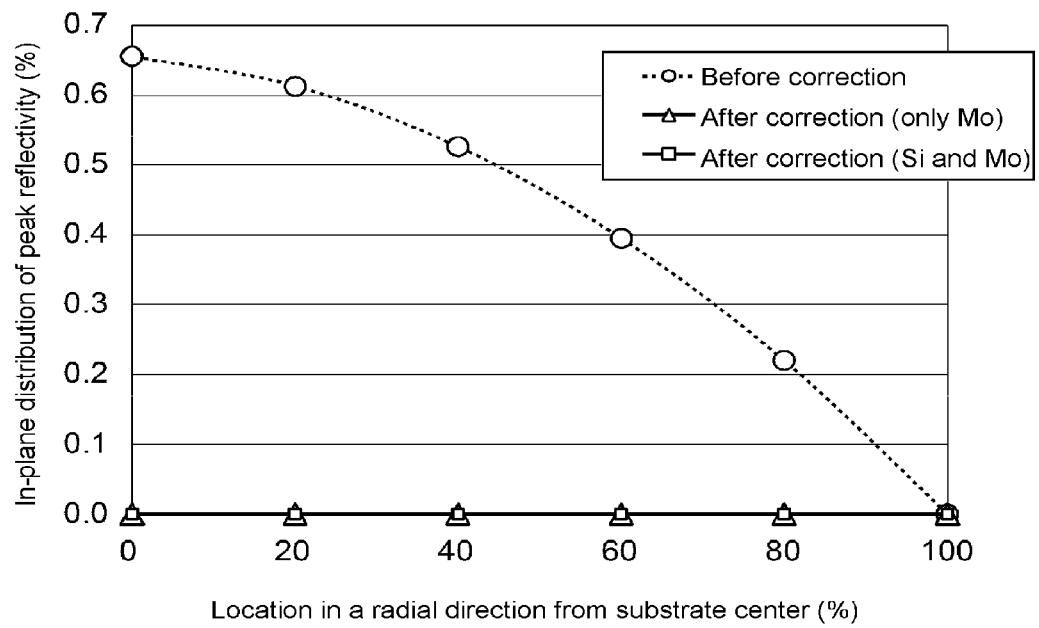
FIG. 8 is a graph showing the relation between the location in a radial direction from the center of the substrate and the in-plane distribution of the peak reflectivity of light in the EUV wavelength region at the surface of a Mo/Si multilayer reflective film in Example 1-2 and Example 1-3, together with the state before correction.

In the same manner as in Reference Example 1, the in-plane distribution of the peak reflectivity in the EUV wavelength region is shown in FIG. 8 (after correction (only Mo)). Further, FIG. 8 (before correction) illustrates the in-plane distribution of the peak reflectivity in Reference Example 1.

Further, as shown in FIG. 8 (after correction (only Mo)), an in-plane distribution occurs such that the peak reflectivity of EUV light lowers from the center of the substrate towards the peripheral portion of the substrate, however, the in-plane distribution of the peak reflectivity of EUV light is at most 0.18%, which satisfies the required value relating to the in-plane uniformity of the peak reflectivity of EUV light.

Example 1-3

In the same manner as in Example 1-1, a bilayer on the uppermost side of a Mo/Si multilayer reflective film is made to be a reflectivity distribution correction layer having a thickness distribution which satisfies the above formula (1) in a radial direction from the center of the substrate. However, a thickness distribution is provided to both Mo layer and Si layer constituting the reflectivity distribution correction layer.

In the same manner as in Reference Example 1, the rate of change of the thickness in a radial direction from the center of the substrate of the bilayer on the uppermost side of the Mo/Si multilayer reflective film is shown in FIG. 7 (after correction (Si and Mo)).

The approximate expression of the change of the thickness in a radial direction shown in FIG. 7 (after correction (Si and Mo)) is represented by the following formula.

$$y=-0.0106x^2+0.08x+100$$

In the same manner as in Reference Example, the in-plane distribution of the peak reflectivity in the EUV wavelength region is shown in FIG. 8 (after correction (Si and Mo)).

As shown in FIG. 8 (after correction (Si and Mo)), an in-plane distribution occurs such that the peak reflectivity of EUV light lowers from the center of the substrate towards the peripheral portion of the substrate, however, the in-plane distribution of the peak reflectivity of EUV light is at most 0.18%, which satisfies the required value relating to the in-plane uniformity of the peak reflectivity of EUV light.

Comparative Example 2

In this Comparative Example, the same operation as in Comparative Example 1 is carried out except that the Si layer to which a thickness distribution in a radial direction is provided is changed from the uppermost layer of the Mo/Si multilayer reflective film to the third Si layer in the stacked number of bilayer of a low refractive index layer (a Mo layer) and a high refractive index layer (a Si layer) from the uppermost layer in the Mo/Si multilayer reflective film (i.e. the third Si layer from the top).

In the same manner as in Reference Example 1, the rate of change of the thickness in a radial direction from the center of the substrate in the third bilayer from the uppermost side of the Mo/Si multilayer reflective film is shown in FIG. 9 (after correction (Comparative Example)). Further, FIG. 9 (before correction) illustrates the rate of change of the thickness in Reference Example 1.

As shown by FIG. 9 (after correction (Comparative Example)), the rate of change of the thickness in a radial direction is substantially constant.

Figure 10:
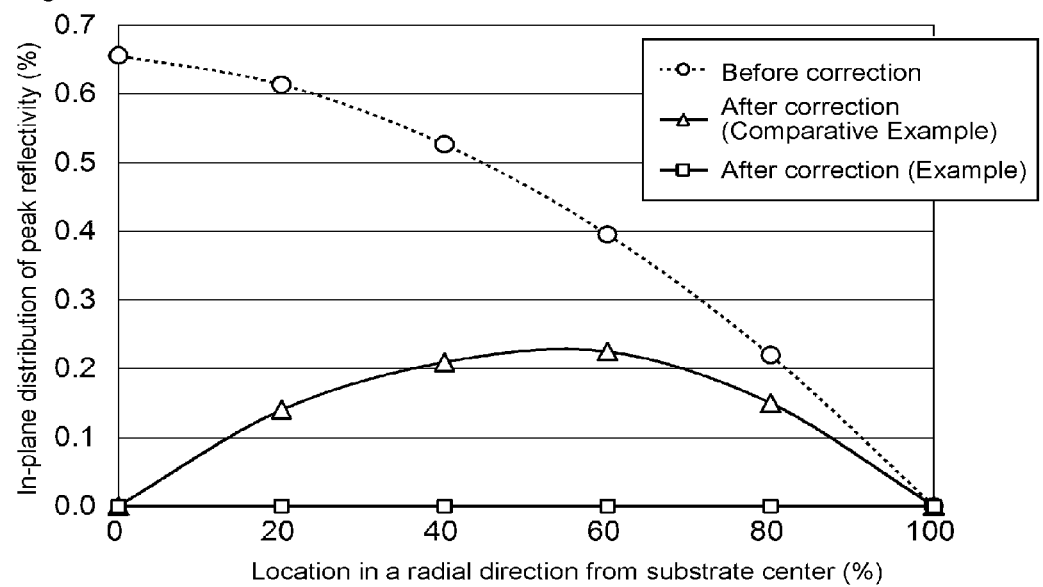
FIG. 10 is a graph showing the relation between the location in a radial direction from the center of the substrate and the in-plane distribution of the peak reflectivity of light in the EUV wavelength region at the surface of a Mo/Si multilayer reflective film in Example 2 and Comparative Example 2, together with the state before correction.

In the same manner as in Reference Example 1, the in-plane distribution of the peak reflectivity in the EUV wavelength region is shown in FIG. 10 (after correction (Comparative Example)). Further, FIG. 10 (before correction) illustrates the in-plane distribution of the peak reflectivity in Reference Example 1.

As shown in FIG. 10 (after correction (Comparative Example)), an in-plane distribution occurs such that the peak reflectivity of EUV light increases from the center of the substrate towards the vicinity of the middle of the center and the peripheral portion of the substrate, and then the peak reflectivity lowers from the vicinity of the middle towards the peripheral portion of the substrate. An in-plane distribution occurs such that the peak reflectivity of EUV light lowers from the center of the substrate towards the peripheral portion of the substrate. The in-plane distribution of the peak reflectivity of EUV light exceeds 0.18%, which does not satisfy the required value relating to the in-plane uniformity of the peak reflectivity of EUV light.

Example 2

In this Example, a third bilayer from the uppermost side of a Mo/Si multilayer reflective film is made to be a reflectivity distribution correction layer having a thickness distribution which satisfies the above formula (1) in a radial direction from the center of the substrate. Accordingly, a thickness distribution is provided to a Si layer constituting the reflectivity distribution correction layer.

In the same manner as in Reference Example 1, the rate of change of the thickness in a radial direction from the center of the substrate of the third bilayer from the upper side of the Mo/Si multilayer reflective film is shown in FIG. 9 (after correction (Example)).

The approximate expression of the change of the thickness in a radial direction shown in FIG. 9 (after correction (Example)) is represented by the following formula.

$$y=-0.0115x^2+0.19x+100$$

In the same manner as in Reference Example 1, the in-plane distribution of the peak reflectivity in the EUV wavelength region is shown in FIG. 10 (after correction (Example)).

As shown in FIG. 10 (after correction (Example)), the peak reflectivity of EUV light is constant, and no in-plane distribution occurs.

Comparative Example 3

In this Comparative Example, the same operation as in Comparative Example 1 is carried out except that the Si layer to which a thickness distribution in a radial direction is provided is two layers of an uppermost Si layer in the Mo/Si multilayer reflective film and the second Si layer in the stacked number of bilayer of a low refractive index layer (a Mo layer) and a high refractive index layer (a Si layer) (i.e. the second Si layer from the top).

In the same manner as in Reference Example 1, the average rate of change of the thickness in a radial direction from the center of the substrate of the first and second bilayers from the top of the Mo/Si multilayer reflective film is shown in FIG. 11 (after correction (Comparative Example)). Further, FIG. 11 (before correction) illustrates the rate of change of the thickness in Reference Example 1.

As shown in FIG. 11 (after correction (Comparative Example)), the rate of change of the thickness in a radial direction is substantially constant.

Figure 12:
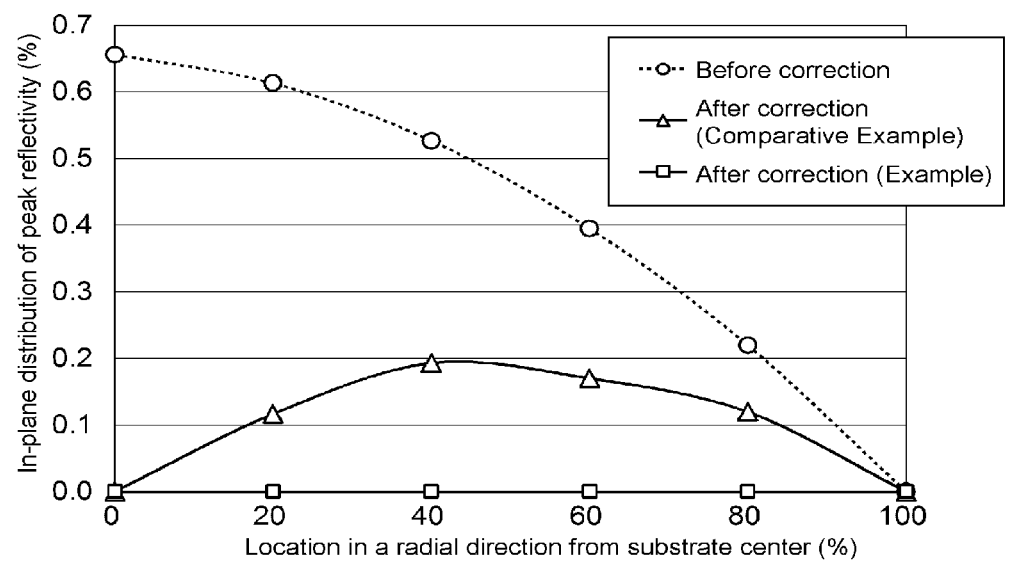
FIG. 12 is a graph showing the relation between the location in a radial direction from the center of the substrate and the in-plane distribution of the peak reflectivity of light in the EUV wavelength region at the surface of a Mo/Si multilayer reflective film in Example 3 and Comparative Example 3, together with the state before correction.

In the same manner as in Reference Example 1, the in-plane distribution of the peak reflectivity in the EUV wavelength region is shown in FIG. 12 (after correction (Comparative Example)). Further, FIG. 12 (before correction) illustrates the in-plane distribution of the peak reflectivity in Reference Example 1.

As shown in FIG. 12 (after correction (Comparative Example)), an in-plane distribution occurs such that the peak reflectivity of EUV light increases from the center of the substrate towards the vicinity of the middle of the center and the peripheral portion of the substrate, and then the peak reflectivity lowers from the vicinity of the middle towards the peripheral portion of the substrate. The in-plane distribution of the peak reflectivity of EUV light exceeds 0.18%, which does not satisfy the required value relating to the in-plane uniformity of the peak reflectivity of EUV light.

Example 3

In this Example, the first and second bilayers from the top of a Mo/Si multilayer reflective film are made to be a reflectivity distribution correction layer having a thickness distribution which satisfies the above formula (1) in a radial direction from the center of the substrate. Accordingly, a thickness distribution is provided to a Si layer constituting the reflectivity distribution correction layer.

In the same manner as in Reference Example 1, the average rate of change of the thickness in a radial direction from the center of the substrate of the first and second bilayers from the top of the Mo/Si multilayer reflective film is shown in FIG. 11 (after correction (Example)).

The approximate expression of the change of the thickness in a radial direction shown in FIG. 11 (after correction (Example)) is represented by the following formula.

$$y=-0.0106x^2+0.08x+100$$

In the same manner as in Reference Example 1, the in-plane distribution of the peak reflectivity in the EUV wavelength region is shown in FIG. 12 (after correction (Example)).

As shown in FIG. 12 (after correction (Example)), the peak reflectivity of EUV light is constant, and no in-plane distribution occurs.

Figure 13:
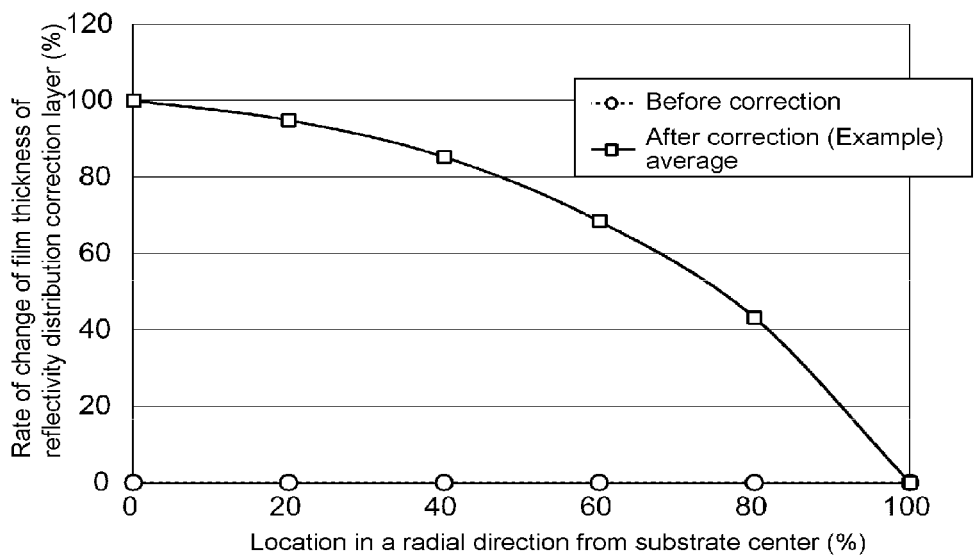
FIG. 13 is a graph showing the relation between the location in a radial direction from the center of the substrate and the average rate of change of the thickness of the reflectivity distribution correction layer in Examples 1-1, 2 and 3, together with the state before correction.

FIG. 13 is a graph illustrating the relation between the location in a radial direction from the center of the substrate and the average rate of change of the thickness of the reflectivity distribution correction layer in Examples 1-1, 2 and 3, together with the state before correction.

The rate of change of the thickness of the reflectivity distribution correction layer shown in FIG. 13 is fitted by a quadratic, whereupon the following formula is obtained. Here, the following formula is obtained under conditions such that x=0, y=100 and y=100 when x=0.

$$y=-0.011x^2+0.1x+100$$

Further, a range within which a favorable distribution is obtained based on the rate of change of the thickness which optimally corrects the reflectivity distribution is reflected on the above formula, whereupon the following formula (1) is obtained.

$$-0.011x^2+0.1x-100-\alpha \le y \le -0.011x^2+0.1x+100+\alpha \quad (1)$$

As described above, α in the formula (1) is 25.

Figure 14:
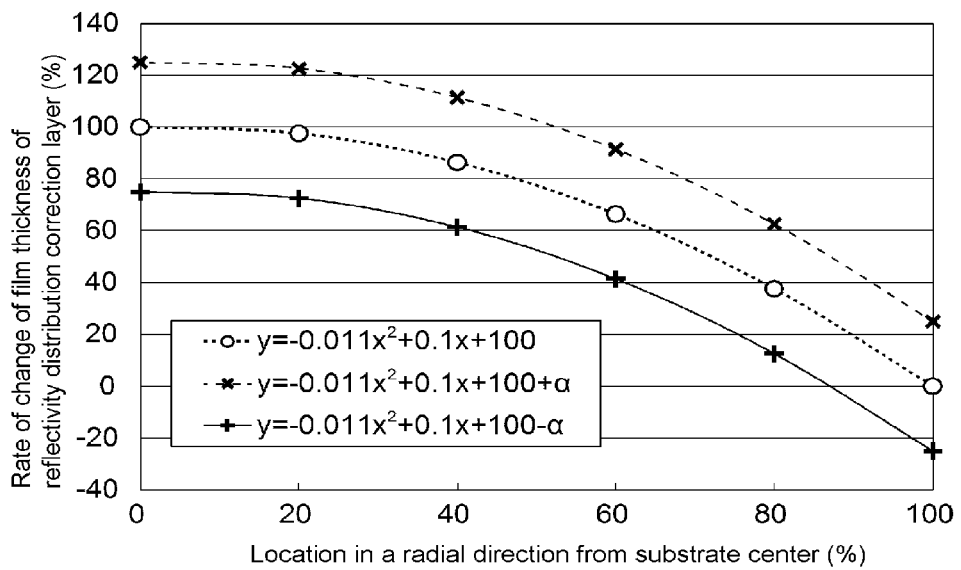
FIG. 14 is a graph showing the relation between the location in a radial direction from the center of the substrate and the rate of change of the thickness of the reflectivity distribution correction layer having a thickness distribution which satisfies the formula (1).

The relation between the location in a radial direction from the center of the substrate and the rate of change of the thickness of a reflectivity distribution correction layer having a thickness distribution which satisfies the formula (1), is shown in FIG. 14.

Figure 15:
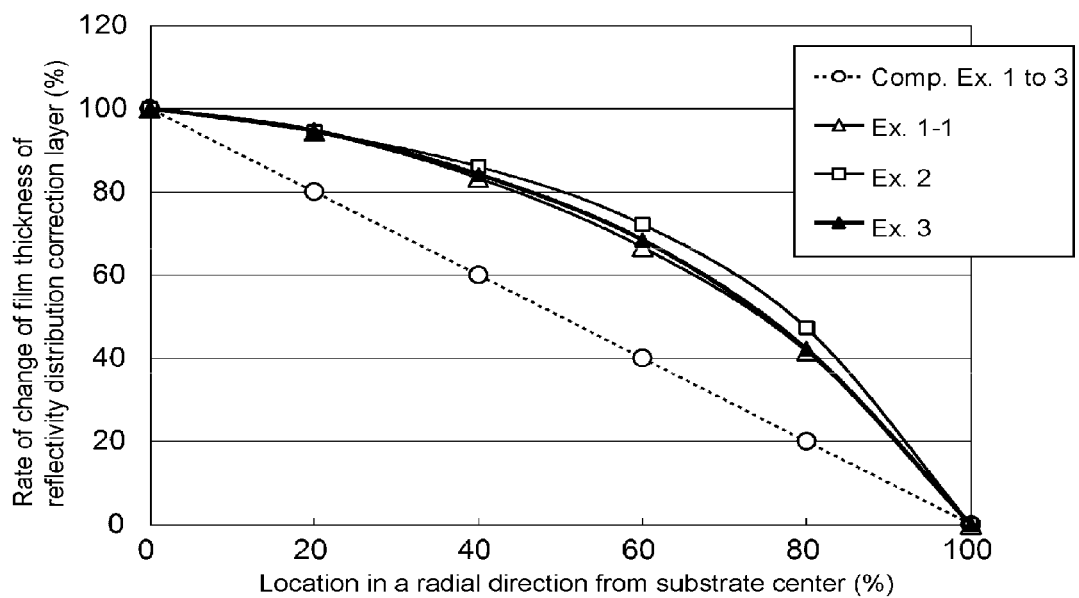
FIG. 15 is a graph showing the relation between the location in a radial direction from the center of the substrate and the rate of change of the thickness of the reflectivity distribution correction layer, in Examples 1-1, 2 and 3 and Comparative Examples 1 to 3.
Figure 16:
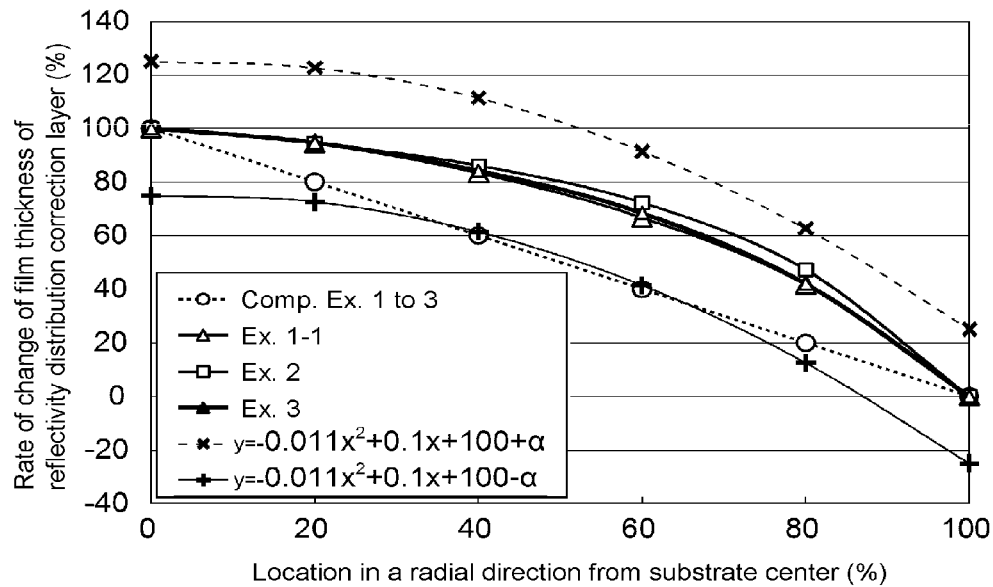
FIG. 16 is a graph which is a combination of FIGS. 14 and 15.

FIG. 15 is a graph illustrating the relation between the location in a radial direction from the center of the substrate and the rate of change of the thickness of the reflectivity distribution correction layer, in Examples 1-1, 2 and 3 and Comparative Examples 1 to 3. The rate of change of the thickness of the reflectivity distribution correction layer in Comparative Examples 1 to 3, is the average value in such Comparative Examples. FIG. 16 is a graph which is a combination of FIGS. 14 and 15.

REFERENCE SYMBOLS 1, 1': EUV mask blank
11: Substrate
12: Reflective layer (Mo/Si multilayer reflective film)
13: Protective layer
14: Absorber layer
15: Low reflective layer
20: Sputtered particles
30: Center axis The entire disclosure of Japanese Patent Application No. 2014-214466 filed on Oct. 21, 2014 including specification, claims, drawings and summary is incorporated herein by reference in its entirety.

What is claimed is:

1. A substrate with reflective layer for EUV lithography (EUVL) having a reflective layer for reflecting EUV light formed on a substrate,
wherein the reflective layer is a multilayer reflective film having a low refractive index layer and a high refractive index layer alternately stacked plural times,
among the respective layers constituting the multilayer reflective film, at least one layer of at least one pair of adjacent low refractive index layer and high refractive index layer is made to be a reflectivity distribution correction layer, and the reflectivity distribution correction layer has a thickness distribution which satisfies the following formula (1) in a radial direction from the center of the substrate:

$$-0.011x^2+0.1x-100-\alpha \leq y \leq -0.011x^2+0.1x+100+\alpha \quad (1)$$

wherein x is a location in a radial direction from the center of the substrate represented by the relative value where the center of the film-forming surface on the substrate on which the reflective layer is to be formed, is 0%, and the outer edge at the reflectivity measurement position farthest from the center of the film-forming surface, is 100%; y is the amount of change of the thickness of the reflectivity distribution correction layer represented by the rate of change where the minimum value of the thickness of the reflectivity distribution correction layer is 0%, and the maximum value of the thickness of the reflectivity distribution correction layer is 100%; and α is 25.

2. The substrate with reflective layer for EUVL according to claim 1, wherein the thickness distribution of the reflectivity distribution correction layer is by the thickness distribution of the low refractive index layer constituting the reflectivity distribution correction layer.

3. The substrate with reflective layer for EUVL according to claim 1, wherein the thickness distribution of the reflectivity distribution correction layer is by the thickness distribution of the high refractive index layer constituting the reflectivity distribution correction layer.

4. The substrate with reflective layer for EUVL according to claim 1, wherein the thickness distribution of the reflectivity distribution correction layer is by the total thickness distribution of the low refractive index layer and the high refractive index layer constituting the reflectivity distribution correction layer.

5. A substrate with reflective layer for EUVL having a reflective layer for reflecting EUV light formed on a substrate, wherein the reflective layer is a multilayer reflective film having a low refractive index layer and a high refractive index layer alternately stacked plural times, and the change of the peak reflectivity of light in the EUV wavelength region in a radial direction from the center of the substrate, is within 0.18%.

6. The substrate with reflective layer for EUVL according to claim 1, which has a protective layer for the reflective layer formed on the reflective layer.

7. The substrate with reflective layer for EUVL according to claim 1, wherein in the multilayer reflective film, the stacked number of bilayer of the low refractive index layer and the high refractive index layer is from 30 to 60, and the reflectivity distribution correction layer is present within a stacked number of bilayer of at most 20 from the uppermost layer of the multilayer reflective film.

8. The substrate with reflective layer for EUVL according to claim 1, wherein the multilayer reflective film is a Mo/Si multilayer reflective film having a molybdenum (Mo) layer and a silicon (Si) layer alternately stacked plural times.

9. The substrate with reflective layer for EUVL according to claim 5, which has a protective layer for the reflective layer formed on the reflective layer.

10. The substrate with reflective layer for EUVL according to claim 5, wherein the multilayer reflective film is a Mo/Si multilayer reflective film having a molybdenum (Mo) layer and a silicon (Si) layer alternately stacked plural times.

11. A process for producing the substrate with reflective layer for EUVL as defined in claim 1, which comprises forming on the substrate the multilayer reflective film by alternately stacking a low refractive index layer and a high refractive index layer plural times by a sputtering method.

12. A reflective mask blank for EUV lithography (EUVL), which has an absorber layer for absorbing EUV light formed on the multilayer reflective film of the substrate with reflective layer for EUVL as defined in claim 1.

13. The reflective mask blank for EUVL according to claim 12, which has a low reflective layer for inspection light to be used for inspection of a mask pattern formed on the absorber layer.

14. A reflective mask for EUV lithography obtained by patterning the reflective mask blank for EUVL as defined in claim 12.

15. A process for producing the substrate with reflective layer for EUVL as defined in claim 5, which comprises forming on the substrate the multilayer reflective film by alternately stacking a low refractive index layer and a high refractive index layer plural times by a sputtering method.

16. A reflective mask blank for EUV lithography (EUVL), which has an absorber layer for absorbing EUV light formed on the multilayer reflective film of the substrate with reflective layer for EUVL as defined in claim 5.

17. The reflective mask blank for EUVL according to claim 16, which has a low reflective layer for inspection light to be used for inspection of a mask pattern formed on the absorber layer.

18. A reflective mask for EUV lithography obtained by patterning the reflective mask blank for EUVL as defined in claim 16.

* * * * *